United States Patent
Sakamaki et al.

(10) Patent No.: US 6,255,762 B1
(45) Date of Patent: *Jul. 3, 2001

(54) FERROELECTRIC ELEMENT AND PROCESS FOR PRODUCING THE SAME

(75) Inventors: Shinichi Sakamaki; Yukimi Takahashi; Yorinobu Yamada, all of Tokorozawa; Motoyuki Toki; Mamoru Aizawa, both of Kyoto, all of (JP)

(73) Assignee: Citizen Watch Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,377
(22) PCT Filed: Dec. 20, 1996
(86) PCT No.: PCT/JP96/03745
    § 371 Date: Jul. 29, 1998
    § 102(e) Date: Jul. 29, 1998
(87) PCT Pub. No.: WO98/02378
    PCT Pub. Date: Jan. 22, 1998

(30) Foreign Application Priority Data

| | | |
|---|---|---|
| Jul. 17, 1996 | (JP) | 8-187117 |
| Sep. 3, 1996 | (JP) | 8-232666 |
| Sep. 10, 1996 | (JP) | 8-238732 |
| Oct. 3, 1996 | (JP) | 8-263105 |

(51) Int. Cl.⁷ .......................... C01B 13/32; C01G 25/00; H01L 41/16
(52) U.S. Cl. .......................... 310/358; 29/253 S
(58) Field of Search .................. 310/358; 29/253 S

(56) References Cited

U.S. PATENT DOCUMENTS

| | | | | |
|---|---|---|---|---|
| 5,091,348 | * | 2/1992 | Woodhead et al. | 501/136 |
| 5,116,643 | * | 5/1992 | Miller et al. | 427/126.3 |
| 5,358,889 | * | 10/1994 | Emesh et al. | 437/60 |
| 5,540,981 | * | 7/1996 | Gallagher et al. | 428/220 |
| 5,630,872 | * | 5/1997 | Ogi et al. | 106/287.18 |
| 5,709,873 | * | 1/1998 | Sanchez et al. | 204/192.18 |
| 5,964,928 | * | 10/1999 | Tomlinson | 106/14.21 |

FOREIGN PATENT DOCUMENTS

| | | | |
|---|---|---|---|
| 61-295208 | 12/1986 | (JP) | C01B/25/00 |
| 5-42672 | 2/1993 | (JP) | B41J/2/045 |
| 5-221643 | 8/1993 | (JP) | B01J/19/00 |
| 5-319826 | 12/1993 | (JP) | C01G/13/18 |
| 6-119811 | 4/1994 | (JP) | B41J/2/045 |
| WO 90/13149 | 11/1990 | (WO) | H01L/41/24 |

* cited by examiner

*Primary Examiner*—Thomas M. Dougherty
(74) *Attorney, Agent, or Firm*—Finnegan, Henderson, Farabow, Garrett & Dunner, L.L.P.

(57) ABSTRACT

A ferroelectric element comprising a ferroelectric material containing at least two metals, the ferroelectric element having been produced by a process including a sol-gel process in the presence of a thickener and/or an association preventive from aqueous solutions of respective salts of the metals. The ferroelectric element is advantageous in that the handling of starting compounds and the production of the ferroelectric element are easy, the storage stability of the starting compound solution is good, the cost is low, the ferroelectric element can be formed as a thin layer, particles on the surface of the thin layer are fine and dense, and, hence, the surface smoothness is good. The ferroelectric element is excellent also in piezoelectric properties and therefore can be advantageously used as a piezoelectric element in a piezoelectric ink jet head.

11 Claims, 15 Drawing Sheets

Fig.2
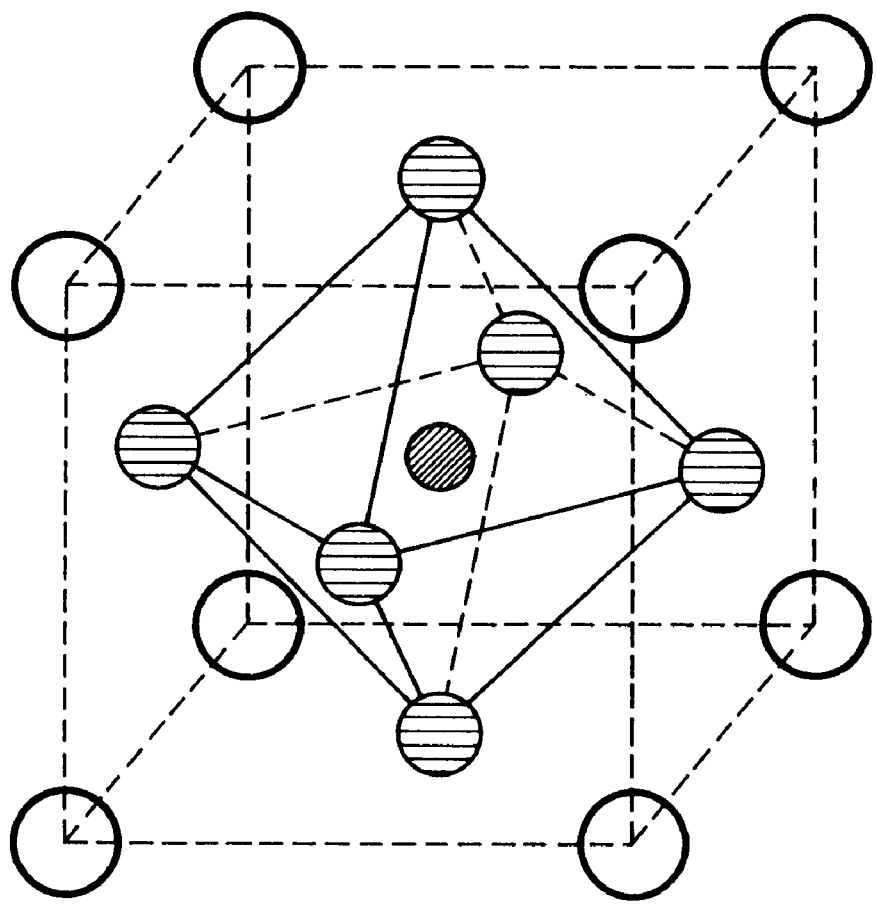
ELEMENT A  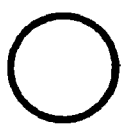
ELEMENT B  
OXYGEN  

(×20)

(×20)

(×20)

FERROELECTRIC ELEMENT AND PROCESS FOR PRODUCING THE SAME

TECHNICAL FIELD

The present invention relates to a ferroelectric element and more particularly to a ferroelectric element particularly in the form of a thin layer, which is advantageously usable as a piezoelectric element in ink jet printers and other devices. The present invention also relates to a process for producing the ferroelectric element and a ferroelectric precursor which can be advantageously used in the production of the ferroelectric element. Further, the present invention relates to a piezoelectric ink jet head using the above ferroelectric element as a piezoelectric element. The term "piezoelectric" and the term "ferroelectric" used herein are defined as follows. Materials, which, when an external force (a stress from the outside) is applied to a crystal thereof, develop polarization, are called piezoelectrics, and, among the piezoelectrics, those wherein the polarization can be reversed by an external electric field are expressly called ferroelectrics.

BACKGROUND ART

In recent years, in office automation equipment, such as word processors, personal computers, facsimile machines, various measuring instruments, such as medical measuring instruments, and other devices, ink jet printers have been extensively used for printing information from these devices at high density. As is well known in the art, in the ink jet printer, an ink droplet is ejected from a head section of the printer and deposited directly onto a recording medium, such as recording paper, to perform monochrome or color printing. The ink jet printer has many advantages including that printing can be performed on even a three-dimensional recording medium, running cost is low since plain paper can be used as the recording medium, the head can be easily mounted in the printer, the need to provide the step of transfer, fixation and the like can be eliminated, color printing is easily performed, and a sharp color printed image can be provided. The head section of the ink jet printer can be classified into several types according to the drive system for ejecting ink droplets from the head section. Among them, a typically and advantageously used one is a piezoelectric ink jet head.

The piezoelectric ink jet head generally comprises: a plurality of ink chambers which are disposed at equidistant spaces and function as an ink flow passage and a pressurizing chamber for ejecting an ink; and a nozzle plate mounted on the front end of the ink chambers and equipped with nozzles, for ejecting an ink, corresponding respectively to the ink chambers; and pressing means for pressurizing an ink within the ink chamber in response to the demand for printing. The pressing means comprises a piezoelectric element (known also as "piezo element"), and electrostrictive effect attained by this piezoelectric element is utilized to create a pressure wave within an ink chamber, filled with ink, in the head section, permitting the ink to be ejected through the nozzle in the head section.

The structure of the piezoelectric ink jet head will be described in more detail with reference to FIG. 1. An ink jet head 10, a part of which is shown in the drawing, has an ink chamber member 11 comprising a plurality of ink chambers 12 serving as an ink flow passage and a pressurizing chamber for ejecting ink. A nozzle plate (not shown) equipped with nozzles disposed so as to correspond respectively to the ink chambers 12 is mounted on the front end of the ink chamber 11. The ink pressurized within the ink chamber 12 can be ejected as a droplet through the bore of the nozzle. In the ink chamber member 11 shown in the drawing, pressing means is mounted on the open face of the ink chamber 12. In the example shown in the drawing, the pressing means comprises: a diaphragm 15 for creating a change in volume of the ink chamber 12; a piezoelectric element 17 as a driving element for distorting the diaphragm 15; and an upper electrode 16 and a lower electrode 18 which can apply voltage according to need, the piezoelectric element 17 being sandwiched between the upper electrode 16 and the lower electrode 18.

Ferroelectric elements have been extensively used as the piezoelectric element for the ink jet head or as an element, for example, for capacitors, actuators, memories and other elements. The ferroelectric element consists essentially of a ferroelectric or a ferroelectric material. Typical ferroelectric materials include an oxide ceramic represented by the general formula $ABO_3$ and having a simple perovskite structure as shown in FIG. 2 and an oxide ceramic having a composite perovskite structure represented by the general formula $(A_1, A_2, \ldots)(B_1, B_2, \ldots)O_3$. The term "perovskite structure" used herein refers to both a simple perovskite structure and a composite perovskite structure unless otherwise specified. As shown in the drawing, a ceramic having the above perovskite structure contains metallic ions A and B in the structure. Examples of more specific ferroelectric materials having the above structure include lead zirconate titanate (PZT) represented by the general formula $Pb(Zr, Ti)O_3$. In particular, ferroelectrics, containing lead (Pb) as one metal component, including PZT are generally known to have large remanence, specific permittivity, and piezoelectric constant and possesses excellent piezoelectricity and ferroelectricity. In the present specification, the ferroelectric material will be described particularly with reference to PZT.

A sol-gel process has hitherto been well known as a technique for the production of PZT, particularly PZT in a thin layer form. Use of the sol-gel process in the production of PZT is advantageous in that a high-purity thin layer of PZT can be formed, the composition of the formed thin layer of PZT can reflect the composition of the starting material used, which facilitates the control of the composition and can provide a thin layer of PZT having high surface smoothness by repetition of spin coating and firing.

The production of a thin layer of PZT by the sol-gel process and use of the thin layer of PZT as a piezoelectric element will be described in more detail. For example, as described in Japanese Unexamined Patent Publication (Kokai) No. 6-112550, lead acetate is dissolved in acetic acid, and the solution is heated under reflux for 30 min. Zirconium tetrabutoxide and titanium tetraisopropoxide are then dissolved in the solution, water and diethylene glycol are added dropwise thereto, and the mixture is satisfactorily stirred to conduct hydrolysis. To the resultant alcohol solution of a PZT precursor is added polyethylene glycol monomethyl ether in an amount of 10% by weight based on the PZT precursor, followed by satisfactory stirring. Thus, a homogeneous sol is prepared. A platinum electrode is formed on a silicon substrate, the sol is then spin-coated onto the electrode, and the coating is heated at about 350° C. Thus, a 2.5 μm-thick, thin, crack-free porous gel layer can be formed.

Subsequently, the same starting material as the above PZT material is hydrolyzed to form a sol. In this case, however, no polyethylene glycol monomethyl ether is added. The sol is spin-coated onto the above thin, porous gel layer to form a coating which is then dried by heating at 400° C. The thin layer thus formed is fired in an oxygen atmosphere for 15 hr. The firing temperature is generally 600 to 700° C. Thus, a thin layer of PZT having a perovskite structure can be formed through the above series of steps. The above sol-gel reaction may be represented by a general formula as shown in FIG. 3 wherein R represents an alkyl group.

Further, hydrothermal synthesis has hitherto been well known as a method for the formation of a thin layer of PZT from an aqueous solution of a main starting compound. The formation of the thin layer of PZT by hydrothermal synthesis will be described. For example, as described in Japanese Unexamined Patent Publication (Kokai) No. 6-112543, 0.2 mol of lead nitrate, 0.104 mol of zirconium oxychloride, and 0.096 mol of titanium tetrachloride are dissolved in a 2 N aqueous potassium hydroxide solution. A silicon substrate with a platinum electrode provided thereon is immersed in the solution, and the system is heated in an autoclave at 160° C. for 30 hr. The substrate is taken out of the autoclave and dried at 200° C. for one hr to form a thin layer of PZT of cubic particles having an average diameter of 5 $\mu$m.

Alternatively, the hydrothermal synthesis may comprise a seed crystal formation process and a crystal growth process. At the outset, in order to form a seed crystal of PZT, a titanium substrate is immersed in water containing lead hydroxide $Pb(OH)_2$ and zirconium hydroxide $Zr(OH)_4$, and the system is heated in an autoclave at a temperature of 140 to 200° C. This heating results in the formation of a thin layer of PZT, capable of serving as a seed crystal for subsequent layer formation, on the surface of the titanium substrate. After the formation of the seed crystal, the titanium substrate is immersed in water containing $Pb(OH)_2$, $Zr(OH)_4$, and titanium hydroxide $Ti(OH)_4$, and the system is heated in an autoclave at a temperature of 80 to 150° C. The heating results in the formation of a layer of PZT, in a coarse particle form, having a larger thickness than the thin layer of PZT formed above on the thin layer of PZT.

The formation of the thin layer of PZT using the hydrothermal synthesis has advantages including that the layer thickness can be increased at a low temperature of 200° C. or below and an additional step, which renders the process complicated, is unnecessary since the piezoelectricity is developed immediately after the layer formation, and the adhesion to the substrate is excellent.

The above conventional methods for producing a ferroelectric material, however, involves many problems to be solved. For example, in the method, described in Japanese Unexamined Patent Publication (Kokai) No. 6-112550, wherein the thin layer of PZT is formed by the sol-gel process using a metal alkoxide as a main starting compound, use of the alcohol as a solvent for the PZT precursor poses a problem that the viscosity of the precursor varies depending upon the moisture content of the air, leading to the occurrence of uneven properties of the formed thin layer of PZT. Further, in order to avoid the adverse effect of the moisture in the air and, therefore, to avoid the formation of insolubilized metal alkoxide, the starting compounds should be mixed together in a specific atmosphere, so that the handling of the starting compounds is not easy. Furthermore, in the sol-gel process, it is difficult to increase the thickness of the thin layer of PZT.

This is true of the hydrothermal synthesis. For example, for the thin layer of PZT formed by the hydrothermal synthesis described in Japanese Unexamined Patent Publication (Kokai) No. 6-112543, the average diameter of PZT particles constituting the thin layer is so large that the surface smoothness of the layer is low and it is difficult to form the upper electrode thereon. Further, the hydrothermal synthesis involves problems which include the density of the thin layer being low due to coarse PZT particles and that potassium (K) is left in the thin layer, adversely affecting the properties.

The present inventors have further made extensive and intensive studies and, as a result, have found that even use of water instead of the alcohol according to the present invention creates problems in some cases.

As described below in detail, according to the present invention, preferably, three metal salts or metal alkoxides, lead nitrate ($Pb(NO_3)_2$), zirconium oxynitrate ($ZrO(NO_3)_2$), and titanium isopropoxide ($Ti(O-i-C_3H_7)_4$), are used as the starting compound to prepare an aqueous PZT precursor solution. The aqueous PZT precursor solution is coated onto a predetermined substrate, and the PZT coating is dried and fired to form a thin layer of PZT. In this case, a first possible problem is association of lead in the step of drying the PZT precursor coating. In general, when components, which are different from each other in solubility in water, are mixed together to prepare an aqueous solution, the components contained in the solution associate with each other in the course of the subsequent step of drying the solution. This phenomenon occurs also in the step of drying the PZT precursor coating, and the association of lead is significant. As a result, there is a possibility that a material is significantly precipitated in the form of crossed stripes on the surface of the thin layer of PZT. More specifically, this is apparent from a microphotograph (magnification: 20×) shown in FIG. 4. The creation of the association of lead is considered to result in not only the creation of undesired defects on the surface of the thin layer but also other problems connected with the defects.

In PZT ceramics, it is known that, regarding the ratio of components constituting the PZT ceramics, a Pb:Zr:Ti:O ratio of 1:0.53:0.47:3 offers the highest piezoelectric properties and, when the ratio deviates from this ratio, the piezoelectric properties are rapidly deteriorated. Therefore, in the thin layer of PZT thus formed, even when the Pb:Zr:Ti:O ratio is the above desired value in the stage of the precursor, the association of lead created in the course of drying leads to an undesired variation of the ratio, resulting in the formation of an uneven layer which provides deteriorated piezoelectric properties. In addition, this lowers the density of the layer.

A second possible problem is the creation of defects such as cracks or pinholes. For example, coating of the queous PZT precursor solution onto a substrate by a conventional method, such as dip coating or spin coating, followed by drying, degreasing, and firing to form a thin layer of PZT often creates cracks when the thickness of the thin layer is 1 $\mu$m or more. The creation of cracks could not be avoided even though the thin layer of PZT is formed by stacking a plurality of thinner layers on top of each other or one another. The creation of cracks in the thin layer of PZT results in lowered density of the layer, making it impossible to form an element, such as an electrode, on the top of the layer. Therefore, the formed thin layer of PZT cannot be used, for example, as a piezoelectric element of an ink jet head. Further, since the aqueous PZT precursor solution used in this case has a low viscosity on the order of several centipoises, the coverage per coating is small and, in addition, pinholes and the like are likely to occur.

In view of the importance of the problem of the creation of cracks or pinholes, the present inventors have made an experiment and, as a result, have found that coating of an aqueous PZT precursor solution having a composition with the Pb:Zr:Ti:O ratio being 1:0.53:0.47:3 (the above described preferred ratio) onto a substrate by dip coating followed by drying at 150° C. develops the formation of protrusions of a material in a crossed stripe form. After the subsequent firing at 700° C. for crystallization, the protrusions were present, and no noticeable disappearance of the protrusions was observed. EDX (energy dispersive X-ray analysis) has revealed that the material in a stripe form constituting the protrusions has a high lead content. Further, when an aqueous solution of lead, an aqueous solution of zirconium, and an aqueous solution of titanium were prepared as described above, dropped on a substrate and allowed to stand at room temperature, a crystal was precipitated only in the queous lead solution.

The thickness of the thin layer of PZT formed from the aqueous PZT precursor solution is 0.05 μm at the largest per coating step, and, in addition, pinholes were created. Further, when a series of steps of coating, drying, degreasing, and firing were repeated ten times, the thickness of the formed thin layer of PZT was 0.5 μm, and, in addition, cracks were created.

DISCLOSURE OF THE INVENTION

Accordingly, a first object of the present invention is to provide a ferroelectric element having advantages including that the handling of starting compounds and the production of the ferroelectric element are easy, the storage stability of the starting compound solution is good, the cost is low, the ferroelectric element can be formed as a thin layer, particles on the surface of the thin layer are fine and dense, and, hence, the surface smoothness is good.

A second object of the present invention is to provide a ferroelectric element which, in addition to the above properties, when formed as a thin layer, permits the layer thickness to be increased and has excellent adhesion to the underlying substrate.

A third object of the present invention is to provide a ferroelectric element which, when formed as a thin layer, does not create any defect, such as a precipitate of a material in a stripe form, on the surface of the thin layer, and enables the formation of a dense and even thin layer and, in addition, possesses excellent piezoelectric properties.

A fourth object of the present invention is to provide a ferroelectric element which, when formed as a thin layer, does not create any defect, such as a precipitate of a material in a stripe form, on the surface of the thin layer, enables the formation of a dense and even thin layer, possesses excellent piezoelectric properties, and, in addition, does not create defects, such as cracks or pinholes.

A fifth object of the present invention is to provide a process for producing the above excellent ferroelectric element.

A sixth object of the present invention is to provide a ferroelectric precursor which can be advantageously used for the production of the above excellent ferroelectric element.

A seventh object of the present invention is to provide a piezoelectric ink jet head comprising the ferroelectric element of the present invention as a piezoelectric element.

Other objects of the present invention could be easily understood from the following detailed description.

According to one aspect of the present invention, there is provided a ferroelectric element comprising a ferroelectric material containing at least two metals, said ferroelectric element having been produced in the presence of a thickener and/or an association preventive from aqueous solutions of respective salts of the metals. Preferably, a sol-gel process is used for the preparation of a solution in the formation of the element.

In this case, as described above, the ferroelectric material consisting essentially of the ferroelectric element of the present invention is preferably an oxide ceramic having a simple or a composite perovskite structure, more preferably lead zirconate titanate (PZT) represented by the general formula $Pb(Zr, Ti)O_3$. The PZT ceramic is preferably, but not limited to, one having a Pb:Zr:Ti:O ratio of 1:0.53:0.47:3 from the viewpoint of good piezoelectric properties and excellent other properties. In the present specification, although the practice of the present invention will be described particularly with reference to the PZT ceramic, the present invention can be advantageously applied also to other ferroelectric materials.

In the ferroelectric element according to the present invention, the thickener added to the aqueous ferroelectric precursor solution is preferably a water-soluble polymeric material which can be heat-decomposed when the temperature exceeds a predetermined temperature in the formation of the element, particularly a water-soluble polymeric material which can be heat-decomposed at the time of degreasing or the like. Suitable thickeners include, but are no limited to, for example, hydroxyalkyl celluloses with the number of carbon atoms in the alkyl group being preferably 2 to 4, for example, hydroxyethyl cellulose or hydroxypropyl cellulose, polyethylene oxide, and polyvinyl alcohol. These thickener compounds may be used alone or as a mixture of two or more.

In the ferroelectric element of the present invention, the association preventive used, either alone or in combination with the thickener, is preferably a water-soluble polyhydric alcohol. Suitable polyhydric alcohols include, but are not limited to, for example, diethylene glycol, polyethylene glycol, and glycerin. These polyhydric alcohols may be used alone or as a mixture of two or more.

In practicing the present invention, preferably, the thickener and/or the association preventive are added to the aqueous ferroelectric precursor solution to permit a powder of a ferroelectric having a crystal structure identical or similar to the ferroelectric to exist.

The ferroelectric element of the present invention is preferably a thin layer which has been formed from the above ferroelectric precursor solution through a solution preparation process using a sol-gel process. Although the thin layer generally has a single layer structure, it may if necessary have a laminate structure of two or more layers.

According to one preferred embodiment of the present invention, a substrate layer having a crystal structure identical or similar to the ferroelectric of the element and formed by hydrothermal synthesis from aqueous solutions of metals necessary for the formation of the substrate layer may be provided as a layer underlying the ferroelectric element in a thin layer form. In this case, the underlying ferroelectric layer, as compared with the ferroelectric provided on the ferroelectric layer, comprises particles having a larger diameter and has a lower density.

According to another aspect of the present invention, there is provided a process for producing a ferroelectric element comprising a ferroelectric material containing at least two metals, said process comprising the steps of:

mixing aqueous solutions of respective salts of the metals together to prepare an aqueous ferroelectric precursor solution;

adding a thickener and/or an association preventive to the aqueous ferroelectric precursor solution and coating the resultant solution onto a substrate; and drying and firing the coating to crystallize the ferroelectric material.

According to still another aspect of the present invention, there is provided a ferroelectric precursor for use as a starting material in the production of a ferroelectric material comprising at least two metals by a process including a sol-gel process, said ferroelectric precursor comprising aqueous solutions of the respective salts of the metals and containing a thickener and/or an association preventive.

According to a further aspect of the present invention, there is provided an ink jet head comprising a plurality of nozzles for ejecting an ink, ink chambers, for passage and pressurization of the ink, communicating with the nozzles, and pressing means for creating a change in volume of the ink in the ink chamber to eject the ink through the nozzles, the pressing means comprising a ferroelectric element as a piezoelectric element, said ferroelectric element comprising a ferroelectric material containing at least two metals and having been produced by a process including a sol-gel process in the presence of a thickener and/or an association preventive from aqueous solutions of respective salts of the metals.

Basically, the ink jet head of the present invention can have the same construction as the piezoelectric ink jet head commonly used in the art and is not particularly limited so far as the thin layer of the ferroelectric is used as the piezoelectric element. Therefore, a suitable ink jet head is, for example, an ink jet head which has been described above with reference to FIG. 1.

BRIEF DESCRIPTION OF THE DRAWINGS

FIG. 2 is a schematic diagram showing the structure of an oxide ceramic having a simple perovskite structure;

BEST MODE FOR CARRYING OUT THE INVENTION

Preferred embodiments of the present invention will be described in more detail particularly with reference to lead zirconate titanate (PZT). An embodiment wherein the ferroelectric element of the present invention is used particularly as a piezoelectric element of an ink jet head will be described. However, it should be noted that the ferroelectric element can also be advantageously applied to other devices.

The ferroelectric element according to the present invention comprises a ferroelectric material containing at least two metals and is produced by using, as starting materials, aqueous solutions of the respective salts of metals constituting the ferroelectric. Specifically, a thickener and/or an association preventive are added to aqueous solutions of metal salts selected for the ferroelectric, preferably aqueous solutions of metal oxides to prepare an aqueous precursor solution, the aqueous precursor solution is coated, either as such or, if necessary, after preparation of a paste from the aqueous precursor solution, onto a substrate, and the coating is dried and fired.

For example, a thin layer of PZT, which is a representative example of the ferroelectric element of the present invention, may be formed by preparing an aqueous solution of a salt of lead, an aqueous solution of a salt of zirconium, and an aqueous solution of a salt of titanium, mixing these aqueous solutions together to prepare an aqueous PZT precursor solution, coating the aqueous precursor solution onto a predetermined substrate, and then subjecting the coating to treatment such as drying and firing.

Figure 5:
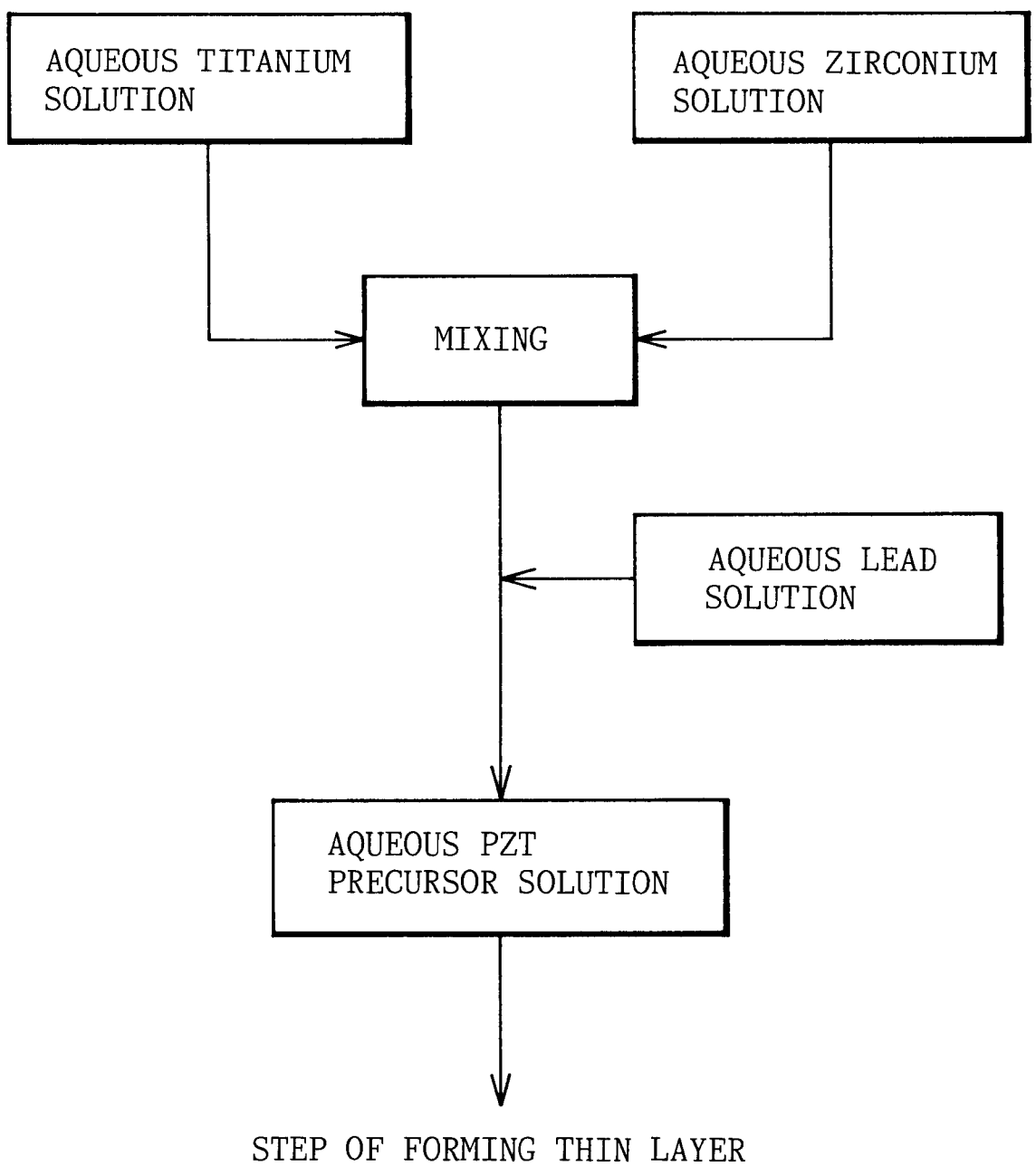
FIG. 5 is a flow sheet showing one preferred embodiment of the process for producing an aqueous PZT precursor solution according to the present invention.
Figure 6:
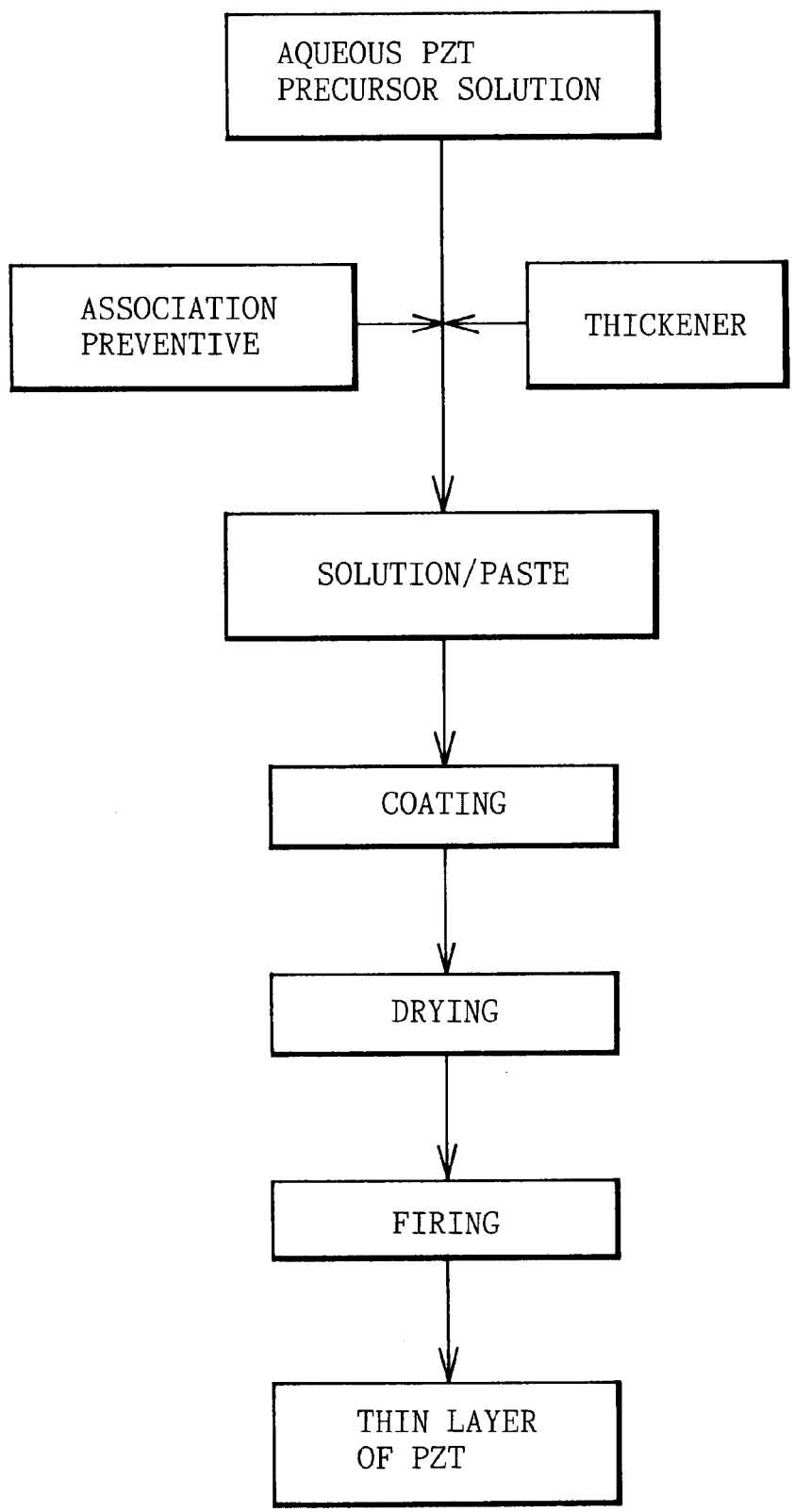
FIG. 6 is a flow sheet showing one preferred embodiment of the process for producing a thin layer of PZT using as a starting material the aqueous PZT precursor solution prepared according to the process as shown in FIG. 5.

The above series of steps for forming the thin layer of PZT are described in more detail in FIGS. 5 and 6 (flow sheets) and will be described below in sequence. One preferred embodiment of each step will be described, but it will be understood that variations and modifications can be effected within the spirit and scope of the invention.

For the formation of a thin layer of PZT described herein, three metal salts, lead nitrate ($Pb(NO_3)_2$), zirconium oxynitrate ($ZrO(NO_3)_2$), and titanium isopropoxide ($Ti(O\text{-}i\text{-}C_3H_7)_4$), are used as the starting compound.

Preparation of Aqueous Titanium Solution

A predetermined amount of titanium isopropoxide ($Ti(O\text{-}i\text{-}C_3H_7)_4$) is dissolved in a 3 N aqueous nitric acid solution, and the solution is stirred in a nitrogen atmosphere to perform mixing. The reason why the mixing is performed in a nitrogen atmosphere is that, when the mixing is performed in air, titanium isopropoxide is insolubilized through a reaction with moisture in air to produce $TiO_2$. The mixing in a nitrogen atmosphere gives a homogeneous aqueous titanium solution through the following reaction.

$$Ti(O\text{-}i\text{-}C_3H_7)_4 + 2H_2O \rightarrow Ti(OH)_4 + 4C_3H_7OH$$

Preparation of Aqueous Zirconium Solution

A predetermined amount of zirconium oxynitrate is dissolved in pure water, and the solution is stirred to perform mixing. The mixing gives a homogeneous aqueous zirconium solution through the following reaction.

$$ZrO(NO_3)_2 + 2H_2O \rightarrow Zr(OH)_4 + 2HNO_3$$

Mixing

The aqueous titanium solution and the aqueous zirconium solution prepared above are mixed together while stirring to prepare a homogeneous solution.

Preparation of Aqueous Lead Solution

A predetermined amount of lead nitrate is dissolved in pure water, and the solution is stirred to perform mixing. The mixing gives a homogeneous aqueous lead solution through the following reaction.

$$Pb(NO_3)_2 + 2H_2O \rightarrow Pb(OH)_2 + 2HNO_3$$

In this case, for example, another salt, such as lead acetate, may be used instead of lead nitrate.

Preparation of Aqueous PZT Precursor Solution

The aqueous lead solution thus prepared is mixed with the mixed aqueous solution, containing titanium and zirconium, prepared above to prepare a homogeneous aqueous PZT precursor solution. The concentration of the aqueous PZT precursor solution is not particularly limited and may be widely varied by taking desired results, film forming conditions and other various conditions, into consideration. The present inventors have found that the concentration of PZT in the aqueous PZT precursor solution is preferably about 5 to 20% by weight, more preferably about 10% by weight. The aqueous PZT precursor solution, as compared with the conventional alcohol solution of the PZT precursor, is easy to handle and is inexpensive. Thus, the series of steps shown in FIG. 5 are completed. Subsequently, the step of forming a thin layer of PZT (see FIG. 6) is carried out.

Addition of Thickener and/or Association Preventive

A thickener and an association preventive are added, either alone or in combination, to the aqueous PZT precursor solution prepared above according to the present invention. These additives may be added in any order. The thickener and the association preventive will be described in more detail below.

After the addition of the necessary additive(s) has been completed, the mixture is thoroughly stirred. Thus, a coating solution for a thin layer of PZT is prepared. If desired, the coating solution may be treated to prepare a paste.

Coating (Formation of Coating)

The coating solution or the paste prepared above is coated on a predetermined substrate to form a desired pattern. The coating may be performed by a conventional method, and examples of coating methods usable herein include spin coating, dip coating, and screen printing. An optimal coating method may be selected according to the type of contemplated thin layer of PZT. Likewise, the coverage, that is, the thickness of the coating formed, may be suitably selected according to various factors. For example, a submicron layer thickness after drying suffices for use of the resultant thin layer of PZT as a memory, a capacitor and the like. On the other hand, a layer thickness on the order of several tens of $\mu$m suffices for use of the thin layer of PZT as an actuator.

Drying

Subsequently, the coating thus formed is dried to cure the coating and, at the same time, to remove excess water or the like by evaporation. The drying temperature and time may be widely varied. In general, however, the drying is performed at about 100 to 200° C. for about 5 to 30 min. For example, drying at 150° C. for 10 min may be adopted. Defects, such as cracks, are not created in the coating in the course of the step of drying. Further, the step of degreasing and other conventional treatment steps (not shown) may be interposed between the step of drying and the step of firing.

Firing

Finally, the dried coating is fired. As with the step of drying described above, the step of firing may be carried out by any method commonly used in the art. The firing temperature is preferably about 500 to 900° C., more preferably about 700 to 800° C. In general, firing at a temperature around 500° C. can offer the desired results. The firing time may be widely varied according to the relationship thereof with the firing temperature or the like. In general, however, it is in the range of about 1 to 60 min. A thin layer of PZT, which has high density and is very high compact, is formed as a result of the firing. As described above, when the firing temperature is low, a problem of scattering of lead (Pb) during the firing can be avoided. Therefore, a high-quality thin layer of PZT can be obtained while maintaining the same composition (Pb:Zr:Ti:O ratio) as that of the PZT precursor provided above.

Figure 3:
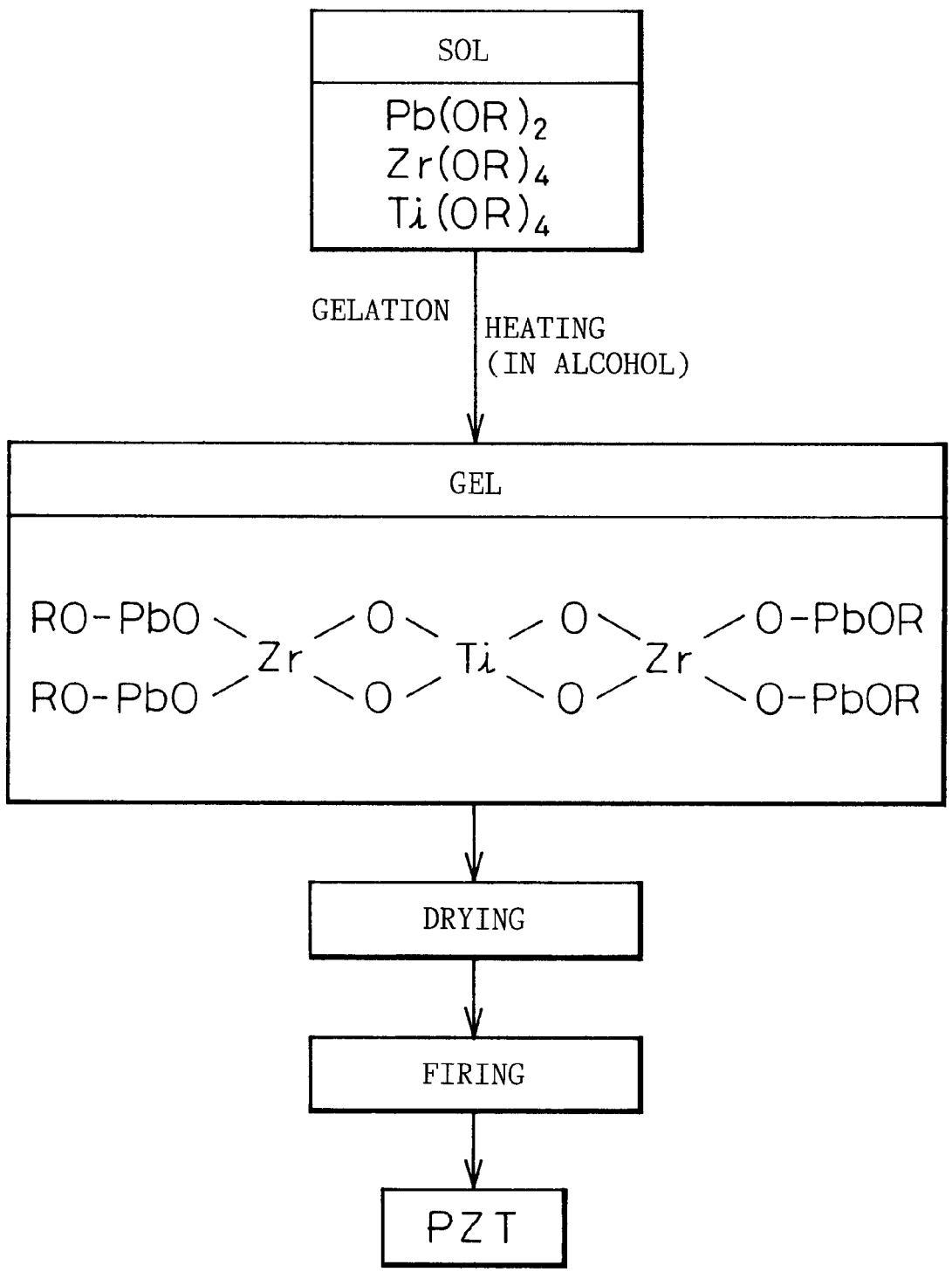
FIG. 3 is a flow sheet showing a process for producing lead zirconate titanate (PZT) by the conventional sol-gel process.
Figure 4:
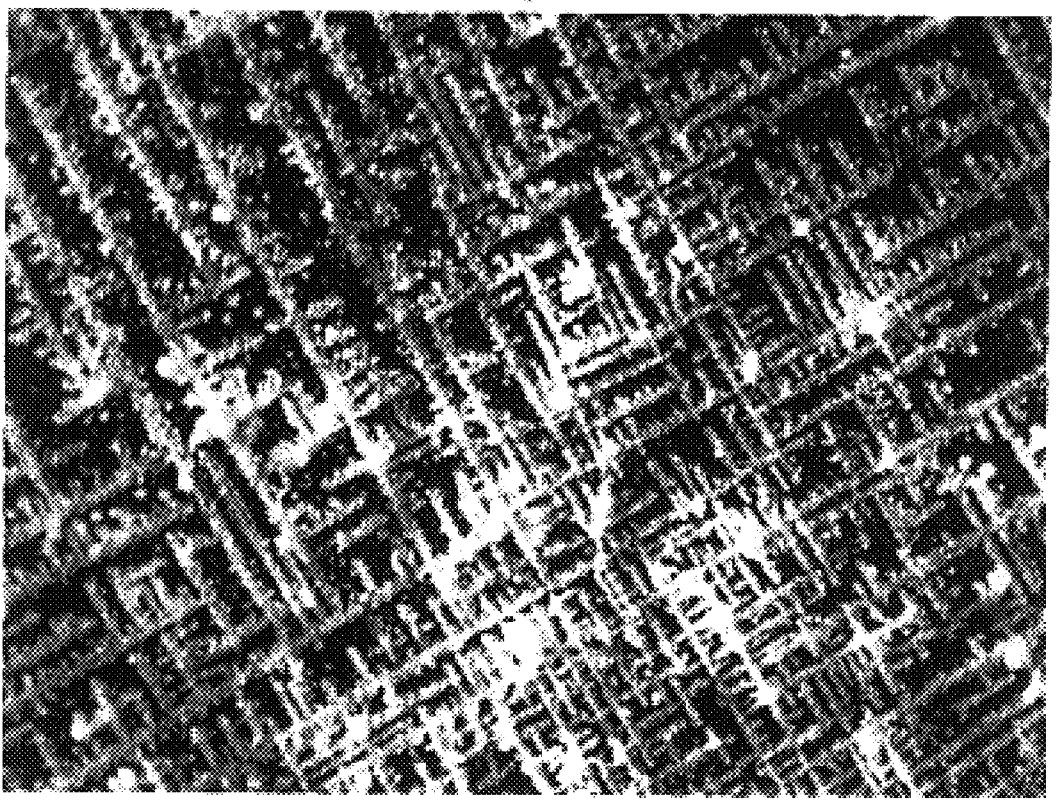
FIG. 4 is a microphotograph showing a material in a crossed stripe form formed on the surface of a thin layer of PZT in the formation of the thin layer of PZT by the conventional liquid phase process.
Figure 7:
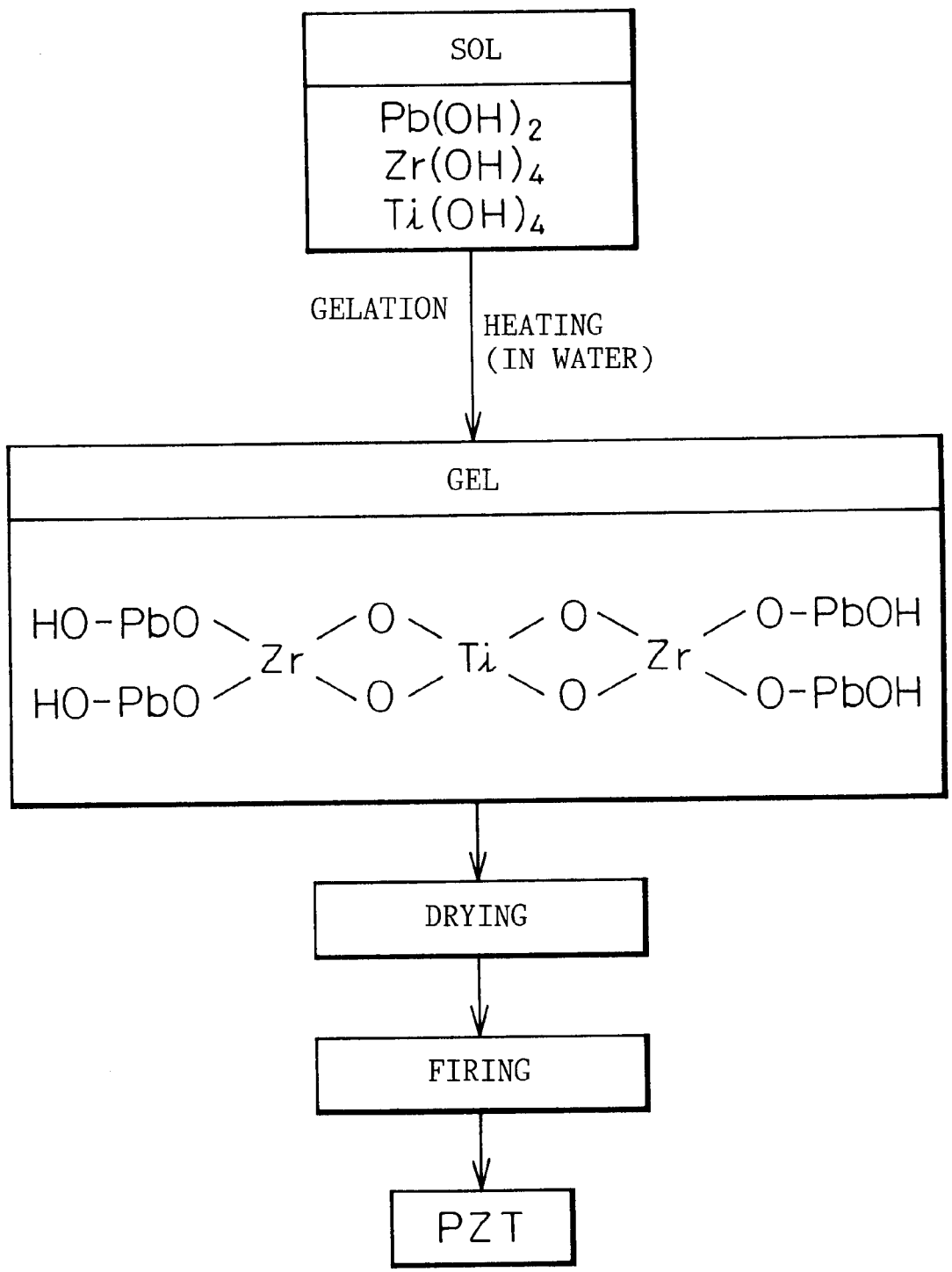
FIG. 7 is a flow sheet showing the process for producing PZT according to the present invention.

The state in the course of the formation of the thin layer of PZT is shown in FIG. 7. From comparison of FIG. 7 with FIG. 3 described above, it will be understood that the structure of the gel according to the present invention is distinguished from that of the conventional gel.

In the formation of the above thin layer of PZT, the Pb:Zr:Ti:O ratio in the PZT precursor may be widely varied according to the desired results. In order to provide the best piezoelectric properties, as described above, it is recommended that Pb:Zr:Ti:O be 1:0.53:0.47:3. In the present invention, when the above composition ratio is adopted in the PZT precursor, the ratio may be reproduced as it is in the thin layer of PZT, enabling a thin layer of PZT, which is homogeneous, has high density and possesses excellent piezoelectric properties, to be easily provided.

Regarding the creation of defects, such as cracks or pinholes, described above in connection with the prior art, according to the present invention, addition of a PZT powder in addition to the thickener and/or the association preventive in the stage of preparing the aqueous PZT precursor solution can effectively prevent the creation of the defects. In this case, preferably, the PZT precursor is in the form of a paste rather than an aqueous solution.

Figure 8:
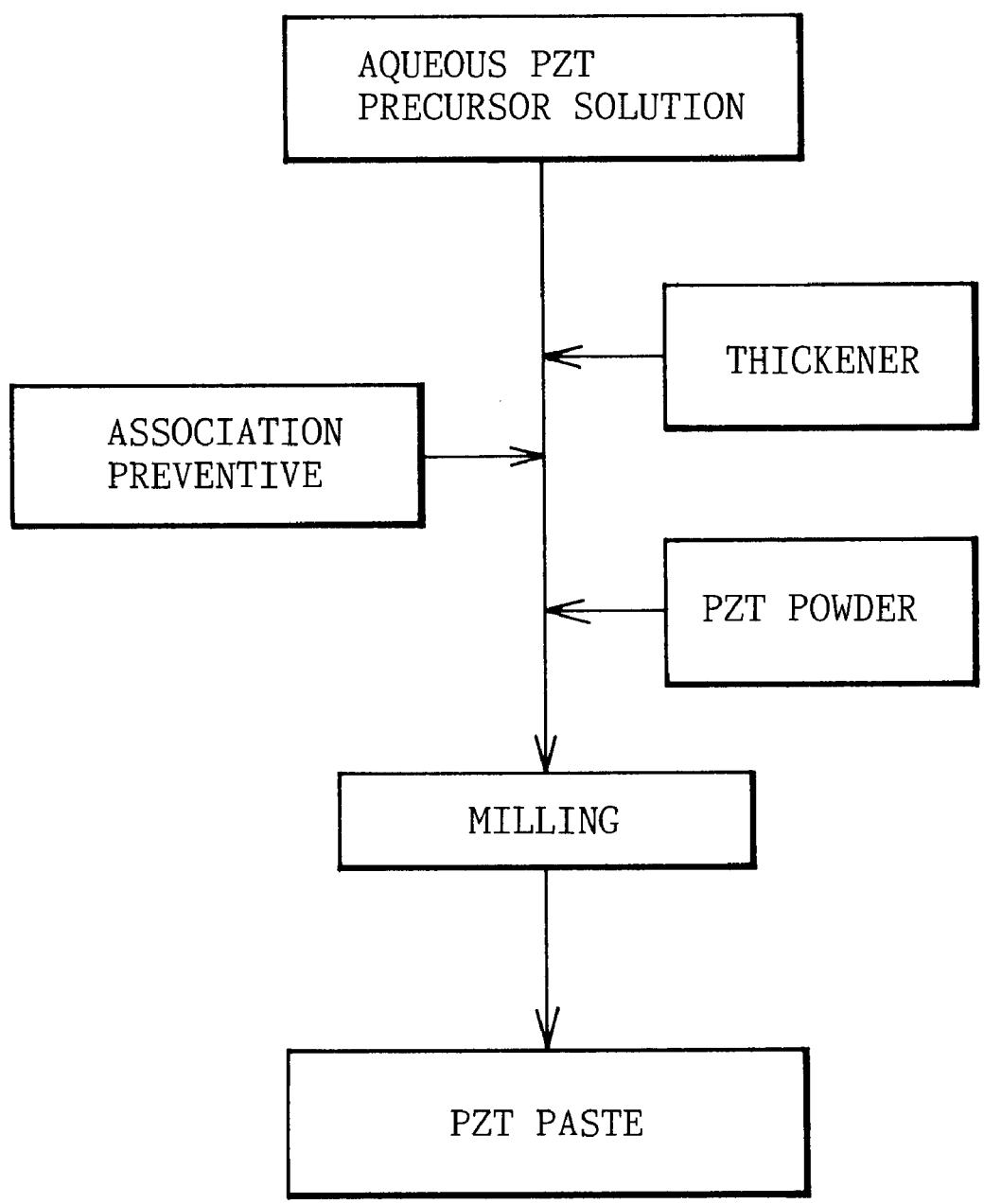
FIG. 8 is a flow sheet showing one preferred embodiment of the process for producing a PZT paste, instead of the aqueous PZT precursor solution, according to the sent invention.

FIG. 8 shows a flow sheet of this preferred embodiment. The procedure described above with reference to FIG. 5 may be repeated up to the step at which the aqueous PZT precursor solution is prepared. Next, as described above with reference to FIG. 6, the thickener and/or the association preventive are added. The PZT powder is added simultaneously with, before or after the addition of these additives. The order of adding the above additives may be properly varied according to the desired results and other factors. PZT powders usable herein will be described in more detail below.

After the addition of the necessary additives has been completed, the mixture is placed in a milling device, for example, a planetary ball mill, followed by milling for several minutes. If necessary, the addition of the PZT powder may be carried out in the step of milling. Thus, a homogeneous paste can be obtained which is then coatable by screen printing or the like. Preferably, after vacuum deaeration for several min by means of a rotary pump, the paste is coated. The steps of coating, drying, and firing may be carried out in the same manner as described above with reference to FIG. 6.

In the practice of the present invention, the aqueous PZT precursor solution may contain a thickener. Preferably, the thickener may be added after the preparation of the aqueous precursor solution. Functions of the thickener include, for example, an improvement in crystallinity of the thin layer of PZT and, when the PZT powder is also used, homogeneous dispersion of the PZT powder. The thickener is often called a binder from the viewpoint of the function. A suitable thickener is a water-soluble polymeric material which can be heatdecomposed when the temperature exceeds a predetermined temperature in the formation of the element (that is, at the time of firing). Examples of thickeners which can be advantageously used in the present invention include, but are not limited to, hydroxyalkyl celluloses with the number of carbon atoms in the alkyl group being preferably 2 to 4 (for example, hydroxypropyl cellulose), polyethylene oxide, and polyvinyl alcohol. These thickener compounds may be used alone or as a mixture of two or more. The amount of the thickener used may be widely varied according to factors such as the desired effects. In general, however, the amount is about 0.1 to 50% by weight based on the total amount of the aqueous PZT precursor solution. Preferably, when the thickener used is hydroxypropyl cellulose, the amount thereof is generally 0.5 to 10% by weight based on the total amount of the aqueous PZT precursor solution. When the purpose of adding the thickener is to homogeneously disperse the PZT powder, the amount of the thickener added may be relatively large.

In the practice of the present invention, the association preventive is used, either in combination with the thickener or independently of the thickener, in the aqueous PZT precursor solution. The association preventive, when contained in the aqueous precursor solution, can be coordinated to a lead (Pb) element contained in the aqueous solution to effectively prevent the association of lead elements with each other which has been the problem of the prior art. A suitable association preventive is a water-soluble polyhydric alcohol, and examples of polyhydric alcohols, which can be advantageously used in the present invention, include, but are not limited to, diethylene glycol, polyethylene glycol, and glycerin. These association preventives may be used either alone or in combination. The amount of the association preventive used may be widely varied according to factors such as the desired effects. In general, however, the amount is about 5 to 20% by weight based on the total amount of the aqueous PZT precursor solution.

In the present invention, it is possible to attain not only the effects inherent in the thickener and the association preventive by the addition of these additives but also the effect, described above, by the dissolution of the PZT precursor in water instead of an alcohol. That is, the problem of the variation in viscosity of the precursor due to the moisture in the air, which is experienced in the use of an alcohol as the solvent, can be avoided. Therefore, the precursor can be easily used in a very stable state. Practice of the sol-gel process using this precursor results in the formation of a thin layer of PZT which is dense and possesses excellent piezoelectric properties.

In the practice of the present invention, when there is a fear of cracks or pinholes being created due to the use of the aqueous PZT precursor solution, or even though the above fear does not exist, addition of another PZT powder having a crystal structure identical or similar to the PZT, in addition to the addition of the thickener and/or the association preventive, to the aqueous PZT precursor solution is preferred. The PZT powder added in this case can simultaneously exhibit various noteworthy functions. For example, the PZT powder, when the PZT coating after drying is fired, can reduce the shrinkage of the coating by the volume of the powder added, leading to the prevention of cracking. Further, addition of the PZT powder can increase the coverage of PZT per coating step and hence can increase the thickness of the thin layer of PZT. The amount of the PZT powder added may widely vary according to factors such as the desired effects. In general, however, the amount is about 5 to 20% by weight based on the total amount of the aqueous PZT precursor solution. The above effects have been described particularly with reference to the addition of a PZT powder. Also in the production of ferroelectric elements other than PZT, addition of a corresponding ferroelectric powder can provide effects comparable favorably with the above effects.

Further, in the practice of the present invention, as described above, addition of the thickener in combination with the PZT powder is preferred. Addition of the thickener enables the viscosity of the PZT precursor paste to be controlled and hence can control the thickness of the resultant thin layer of PZT. Addition of the additives followed by agitating operation, such as milling, permits the mixed PZT powder to be homogeneously dispersed. Further, settling of the PZT powder can be effectively prevented. Furthermore, the addition of the thickener can improve the wettability of the substrate by the PZT paste and the adhesion of the thin layer of PZT after firing to the substrate. When the thickener is used in combination with the PZT powder, the amount of the thickener used may vary widely depending upon the desired viscosity, the desired effects and other factors in the paste. In general, however, the amount is about 1 to 30% by weight based on the total amount of the aqueous PZT precursor solution.

The addition of additional additives brings the PZT precursor as the starting material in the form of a solution to a paste. The resultant PZT paste may be coated by the above-described methods, such as spin coating and dip coating. When the viscosity is taken into consideration, however, coating may be advantageously performed by screen printing and other methods commonly used in the field of coating formation. Use of the screen printing enables the PZT coating to be formed in a desired pattern and, at the same time, can facilitate increasing the coating thickness.

Thus, addition of the PZT powder, in addition to the thickener and/or the association preventive, to the aqueous PZT precursor can provide a PZT paste which has excellent storage stability and high PZT concentration. Use of this paste results in the formation of a thin layer of PZT which is free from defects, such as pinholes and cracks, and possesses excellent piezoelectric properties.

According to another preferred embodiment of the present invention, a ferroelectric element, such as a thin layer of PZT, is produced by combining hydrothermal synthesis with the sol-gel process. In this case, the hydrothermal synthesis is basically used for the formation of a first layer (that is, a ferroelectric substrate layer) of the ferroelectric element by the conventional method. On the other hand, the sol-gel process is basically used for the formation of a second layer (an upper ferroelectric layer) of the ferroelectric element using as a starting material an aqueous ferroelectric precursor solution containing at least a thickener and/or an association preventive and optionally a ferroelectric powder.

That is, the ferroelectric element according to this preferred embodiment is characterized in that the upper ferroelectric layer constituting the main part of the ferroelectric element has, on the underside thereof, the ferroelectric substrate layer which has a crystal structure identical or similar to the ferroelectric material constituting the upper ferroelectric layer and has been formed, from aqueous solutions of metals necessary for the formation of the ferroelectric substrate layer, by hydrothermal synthesis. In the above composite ferroelectric element, preferably, the ferroelectric material for the ferroelectric substrate layer, as compared with the ferroelectric material for the upper ferroelectric layer, is constituted by particles having a larger diameter and has lower density.

Figure 9:
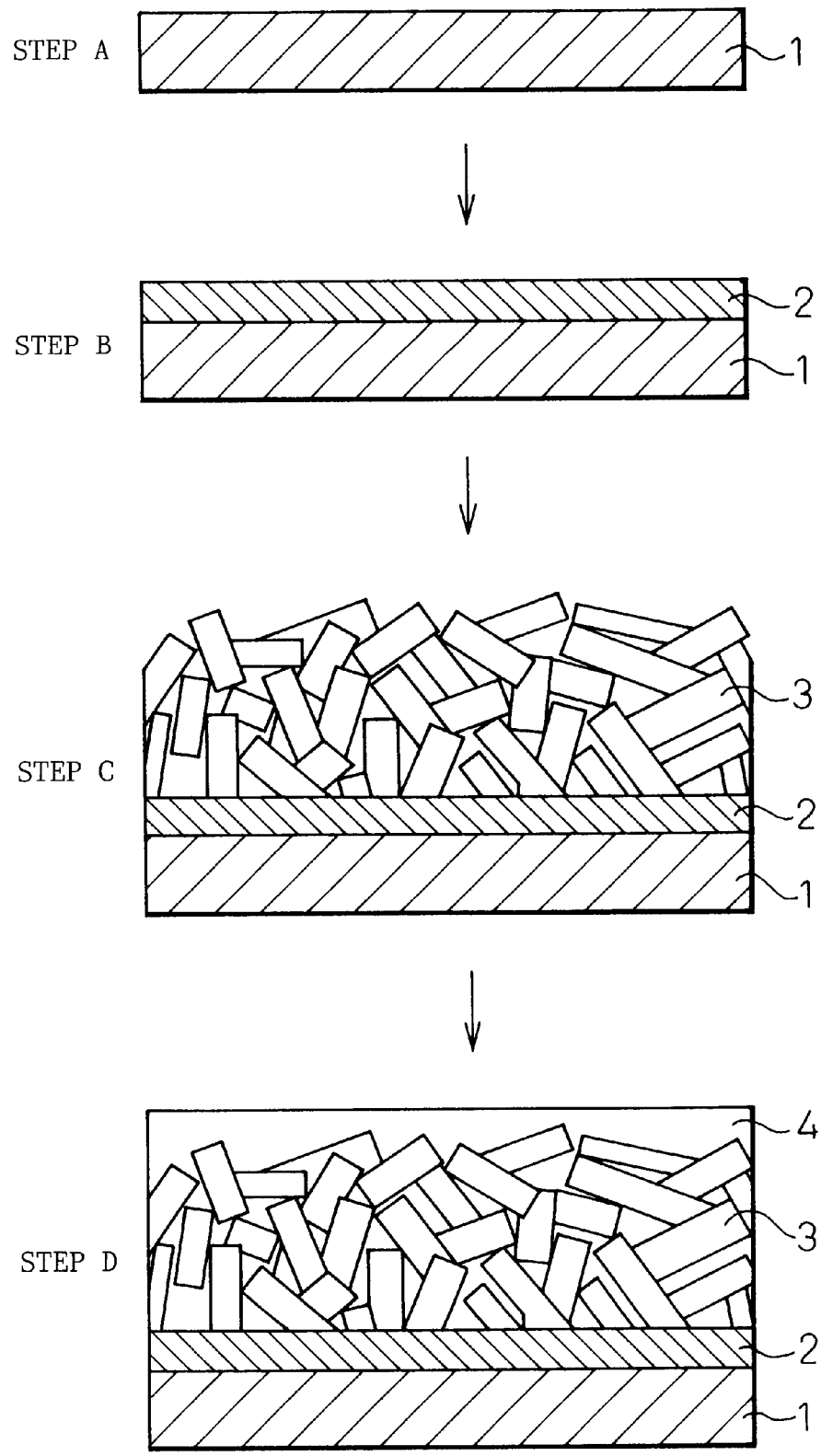
FIG. 9 is a cross-sectional view showing the steps of forming a thin, composite PZT layer in sequence according to another preferred embodiment of the present invention.

Preferably, the above composite ferroelectric element, for example, a composite thin PZT layer, may be produced, for example, by a process comprising steps shown in sequence in FIG. 9.

At the outset, as shown in the step A, a substrate 1 is provided. For the substrate, the type, shape and the like may widely vary depending upon the contemplated application of the composite thin PZT layer and other factors. Suitable substrates include, for example, conventional substrates, such as ceramic substrates, for example, silicon substrates and titanium substrates, and glass substrates. The substrate may have thereon a layer, such as an insulating layer, wiring, or an electrode. In the present embodiment, a titanium substrate is used.

Next, in the step B, a seed crystal layer 2 of PZT is formed on the titanium substrate 1. The seed crystal layer 2 may be formed, for example, by immersing the titanium substrate 1 in water containing lead hydroxide ($Pb(OH)_2$) and zirconium hydroxide ($Zr(OH)_4$) and heating the system in an autoclave at a temperature of 140 to 200° C.

After the formation of the seed crystal layer 2 has been completed, in the step C, a first PZT layer (substrate layer) 3 is further formed on the seed crystal layer 2. This PZT layer 3 may be formed, for example, by immersing the titanium substrate 1, with the seed crystal layer 2 formed thereon, in water containing $Pb(OH)_2$, $Zr(OH)_4$, and titanium hydroxide ($Ti(OH)_4$) and heating the system in an autoclave at a temperature of 80 to 150° C. As a result, on the seed crystal layer 2 formed above is formed a PZT layer 3, as shown in the drawing, which, as compared with the seed crystal layer 2, is constituted by coarser particles and has larger layer thickness. The PZT layer 3 is advantageous in that an increase in the layer thickness is possible at a low temperature and, in addition, the PZT layer 3 can develop piezoelectricity immediately after the layer formation and has good adhesion to the titanium substrate 1.

Finally, in the step D, a second PZT layer 4 is formed using the aqueous PZT precursor solution or the paste according to the present invention. Disposition of the PZT layer 4 on the first PZT layer 3 can smoothen the roughened surface of the underlying PZT layer 3. Since the surface of the composite thin PZT layer is smooth, an electrode and the like may be easily formed thereon with high reliability. In the case of the above two-layer structure, the creation of defects, such as cracks or pinholes, can be prevented in the composite thin PZT layer.

The ferroelectric element according to the present invention can be advantageously used for constituting pressing means in a piezoelectric ink jet head, that is, an ink jet head comprising: a plurality of nozzles for ejecting an ink; an ink chamber, communicating with the nozzles, for flow and pressurization of the ink; and pressing means for creating a change in volume of the ink in the ink chamber to eject the ink through the nozzle.

As described above, the ink jet head per se can have the same construction as the piezoelectric ink jet head commonly used in the art. The ink jet head of the present invention will be described again with reference to FIG. 1.

An ink chamber 12 in an ink jet head 10 is provided in a predetermined pattern in an ink chamber member 11.

The ink chamber member 11 may be made of various materials according to factors such as the method for forming the ink chamber 12. One embodiment of the ink chamber member 11 will be described. For example, glass, a plastic material, for example, a polyester resin (such as PET), an acrylic resin (such as PMMA), quartz, or other substrate is provided, and a resin material may be then patterned onto the substrate by photolithography or another method to form a groove corresponding to the ink chamber.

In the ink chamber member 11 shown in the drawing, a diaphragm 15 for creating a change in volume of the ink chamber 12 (one constituent element of pressing means referred to in the present invention) is provided on the open face of the ink chamber 12. The diaphragm 15 may be integrally molded with the ink chamber member 11 at the time of formation of the ink chamber member 11. Otherwise, it may be bonded to the ink chamber member 11 with the aid of an adhesive. Suitable materials for the diaphragm 15 include, for example, ceramics having high rigidity, for example, $ZrO_2$. The remaining elements of the pressing means are attached so as to abut against the diaphragm 15.

In the case of the embodiment shown in the drawing, the remaining elements of the pressing means are a piezoelectric element 17 as a drive for distorting the diaphragm 15 and an upper electrode 16 and a lower electrode 18 which sandwich the piezoelectric element 17 therebetween and, when necessary, can apply a voltage. The piezoelectric element 17 may be formed by the above process according to the present invention. The electrodes 16 and 18 each may be formed in a desired pattern by a conventional method, for example, sputtering, screen printing, or vapor deposition.

The ink jet head shown in the drawing may be operated as follows. An ink is fed into the ink chamber 12 through an ink feed port (not shown) of the head 10 to fill the ink chamber 12 with the ink. In this state, application of a voltage across the electrodes 16 and 18 creates a displacement of the piezoelectric element 17 sandwiched between these electrodes due to the piezoelectric properties, permitting the diaphragm 15 disposed so as to abut against the piezoelectric element 17 to be pushed out towards the ink chamber 12. This reduces the volume of the ink filled into the ink chamber 12, leading to ejection of the ink in a dot form in an amount corresponding to the reduction of the volume through a nozzle (not shown) communicating with the ink chamber 12.

EXAMPLES

The present invention will be described in more detail with reference to the following examples. It should be understood that the present invention is not limited to these examples only.

Example 1

0.014 mol of titanium tetraisopropoxide was dissolved in 30 g of a 3 N aqueous nitric acid solution to prepare an aqueous titanium solution. Separately, 0.016 mol of zirconium oxynitrate was dissolved in 20 g of pure water to prepare an aqueous zirconium solution. Further, 0.03 mol of lead nitrate was dissolved in 20 g of pure water to prepare an aqueous lead solution.

The three aqueous solutions thus prepared were mixed together to prepare an aqueous PZT precursor solution. In this connection, it should be noted that the ratio of Zr to Ti in PZT is closely related to the ferroelectricity. Therefore, in the preparation of the aqueous solutions followed by mixing of these aqueous solutions, this has been taken into consideration, and the preparation and mixing were performed so that the finally formed thin layer of PZT had a desired composition ratio (Pb:Zr:Ti:O=1:0.53:0.47:3), At the outset, the aqueous titanium solution and the aqueous zirconium solution were thoroughly mixed together at room temperature while stirring. After the completion of the stirring, the mixture was mixed with the aqueous lead solution. The resultant mixture was thoroughly stirred at room temperature and then heated under reflux at a temperature of 100° C. or above to conduct hydrolysis. Metal ions contained in each aqueous solution, when the aqueous solutions were mixed together at room temperature, merely formed corresponding metal hydroxides, and the degree of bonding among the metal ions was small. Subsequent reflux and hydrolysis, however, permit the metal ions, that is, titanium, zirconium, and lead ions, to be bonded to one another through oxygen. In this case, a Pb—O—Ti—O—Zr bond is formed to bring the system to a sol. In the present invention, the aqueous solution in this sol state is expressly called an "aqueous PZT precursor solution."

After the temperature of the aqueous PZT precursor solution was returned to room temperature, water and a small amount (about 0.5% by weight) of hydroxypropyl cellulose were added thereto, followed by thorough mixing with stirring at room temperature for about one hour. As a result, a transparent, homogeneous solution was obtained which was neither cloudy nor contained any precipitate.

In this connection, it was confirmed that hydroxypropyl cellulose added to the aqueous PZT precursor solution has various effects. Specifically, hydroxypropyl cellulose increases the viscosity of the aqueous PZT precursor solution having relatively low viscosity and, when the aqueous PZT precursor solution is coated on the substrate in the step of coating, enables the formation of a coating having large thickness. Not only has hydroxypropyl cellulose the effect of increasing the viscosity, but also the effect of strengthening the Pb—O—Ti—O—Zr bond and the effect of reducing the distance among the metal ions. Although the reason why these effects can be attained has not been fully elucidated yet, according to studies conducted by the present inventors, it is believed that the metal ions and oxygen are intertwined with hydroxypropyl cellulose as the backbone, leading to the above effects. As a result, the firing temperature in the layer formation can be lowered, resulting in improved crystallinity of the thin layer.

The results of an experiment conducted by the present inventors to confirming the above excellent effects of hydroxypropyl cellulose will be described.

The aqueous PZT precursor solution prepared as described above was placed in a crucible and fired at a predetermined temperature for a given period of time. As a result, a light-yellow PZT powder (sample 1) was obtained. For comparison, a light-yellow PZT powder (sample 2) was prepared in the same manner as described above, except that hydroxypropyl cellulose (thickener) was not used. For the samples, the X-ray diffraction pattern was measured. The results were as shown in FIG. 10 (sample 1) and FIG. 11 (sample 2).

Figure 10:
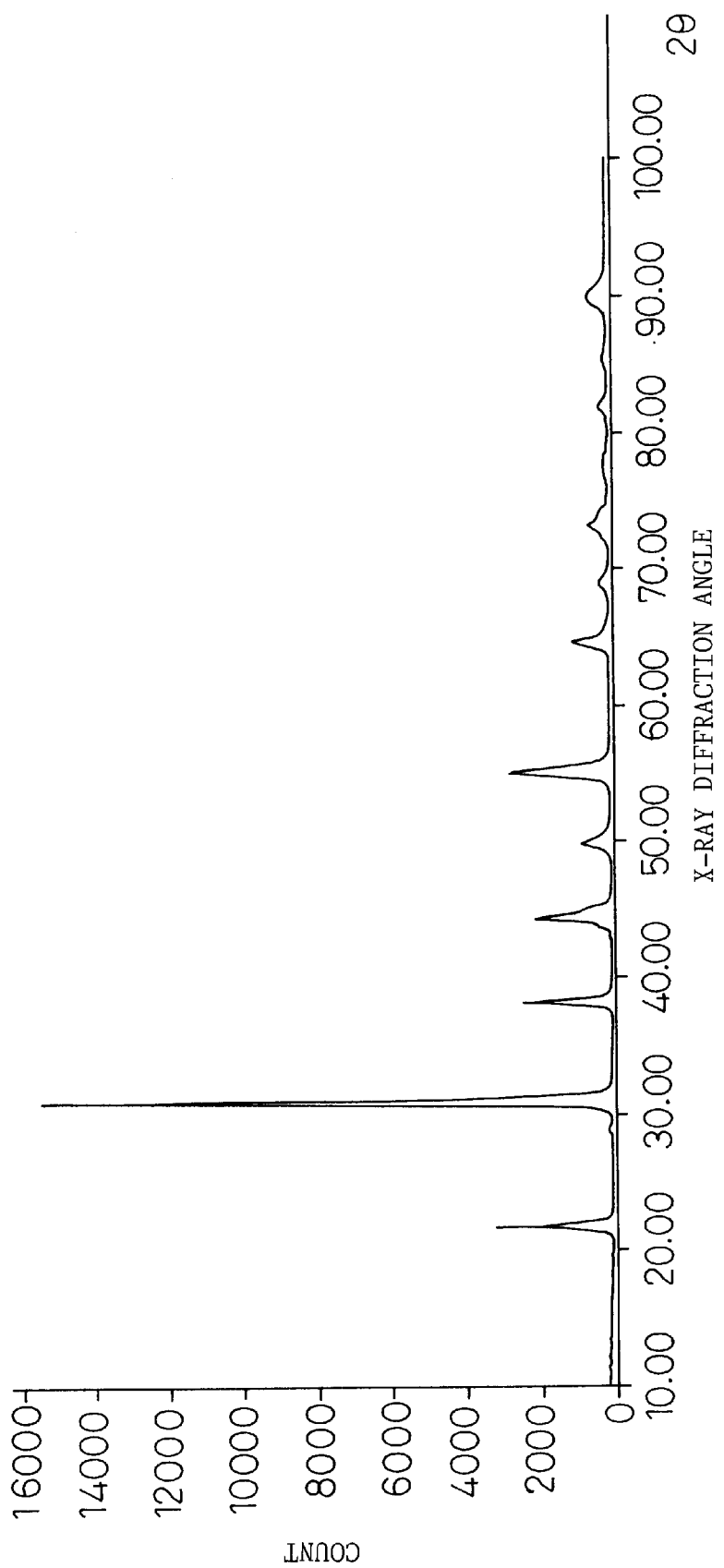
FIG. 10 is a graph showing an X-ray diffraction pattern of a PZT powder prepared using hydroxypropyl cellulose as a thickener according to the present invention.
Figure 11:
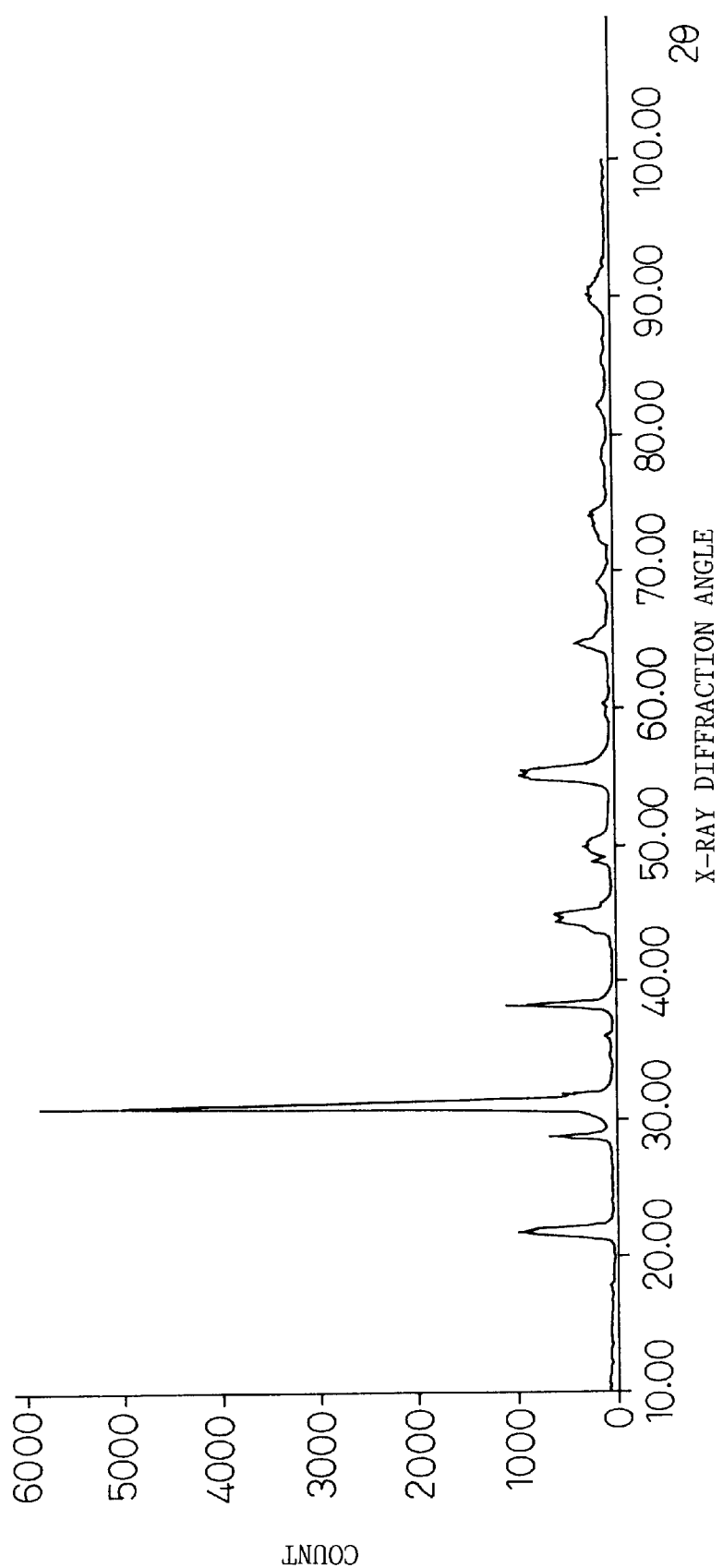
FIG. 11 is a graph showing an X-ray diffraction pattern of a comparative PZT powder prepared without use of any thickener.

In the X-ray diffraction patterns shown in FIGS. 10 and 11, a peak around an X-ray diffraction angle 2θ=29° is one, derived from a pyrochlore layer which appears when the crystallization of PZT is unsatisfactory. The crystallinity of PZT can be quantitatively determined by comparing the intensity of this peak with the peak intensity of the (101) face having the highest diffraction intensity among the PZT diffraction peaks. For sample 1 (FIG. 10) which is an example of the present invention, the proportion of the pyrochlore layer was 1.3%, whereas for sample 2 (FIG. 11) which is a comparative example, the proportion of the pyrochlore layer was 11.6%. This indicates that addition of hydroxypropyl cellulose as the thickener can provide a more complete PZT crystal.

Example 2

Figure 1:
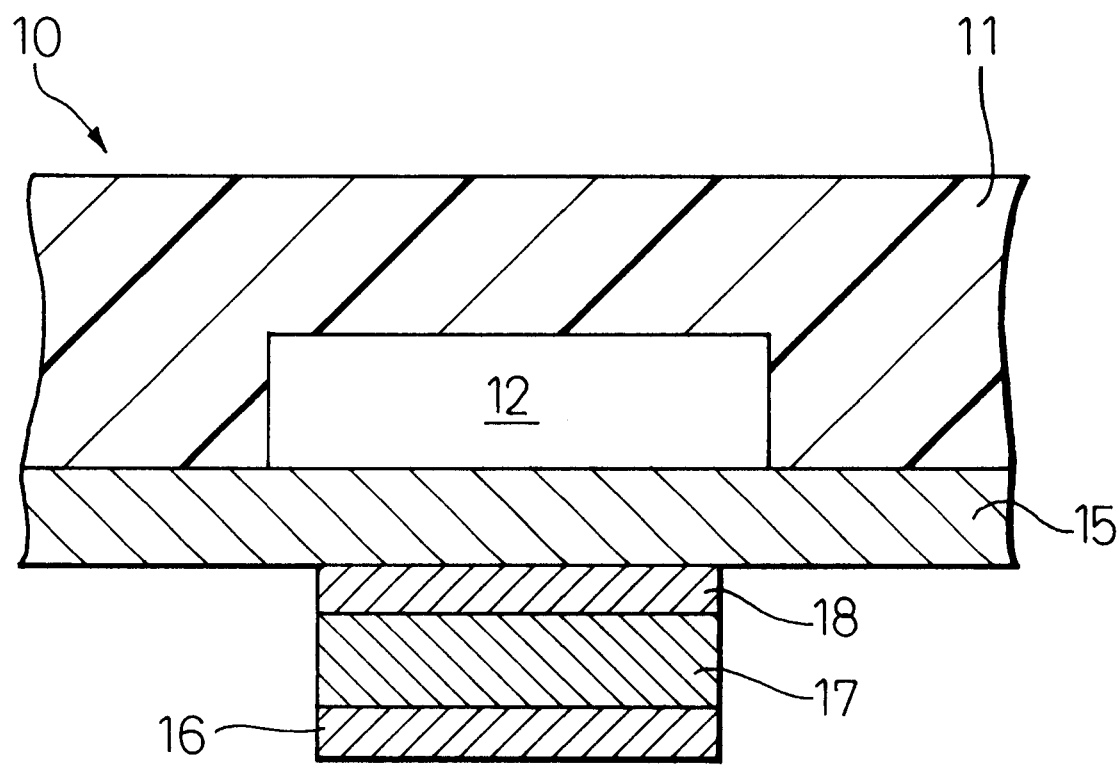
FIG. 1 is a cross-sectional view showing a principal part of a conventional piezoelectric ink jet head.

A thin layer of PZT was formed from the aqueous PZT precursor solution prepared in Example 1, and the thin layer of PZT was incorporated as a piezoelectric element into a piezoelectric ink jet head having a structure shown in FIG. 1.

A diaphragm of a thin ceramic sheet was prepared, and a platinum electrode was formed in a predetermined area by sputtering. Further, the aqueous PZT precursor solution prepared in Example 1 was spin-coated at 2000 rpm onto the platinum electrode. The PZT coating on the platinum electrode was dried at 150° C. for 10 min and further pre-fired at 550° C. for one hr. As a result of the pre-firing, hydroxypropyl cellulose contained in the PZT coating was decomposed and scattered.

The PZT coating on the platinum electrode was then fired at 700° C. for one min. This allowed the crystallization of PZT to proceed and a thin layer of PZT having a perovskite structure was obtained. This thin layer of PZT had good adhesion to the platinum electrode and the diaphragm and further exhibited satisfactory adhesion in the sputtering of an additional platinum electrode on the thin layer of PZT. Further, since a relatively low temperature can be applied to the firing of the thin film of PZT, the range of selection of the underlying diaphragm can be broadened.

Figure 12:
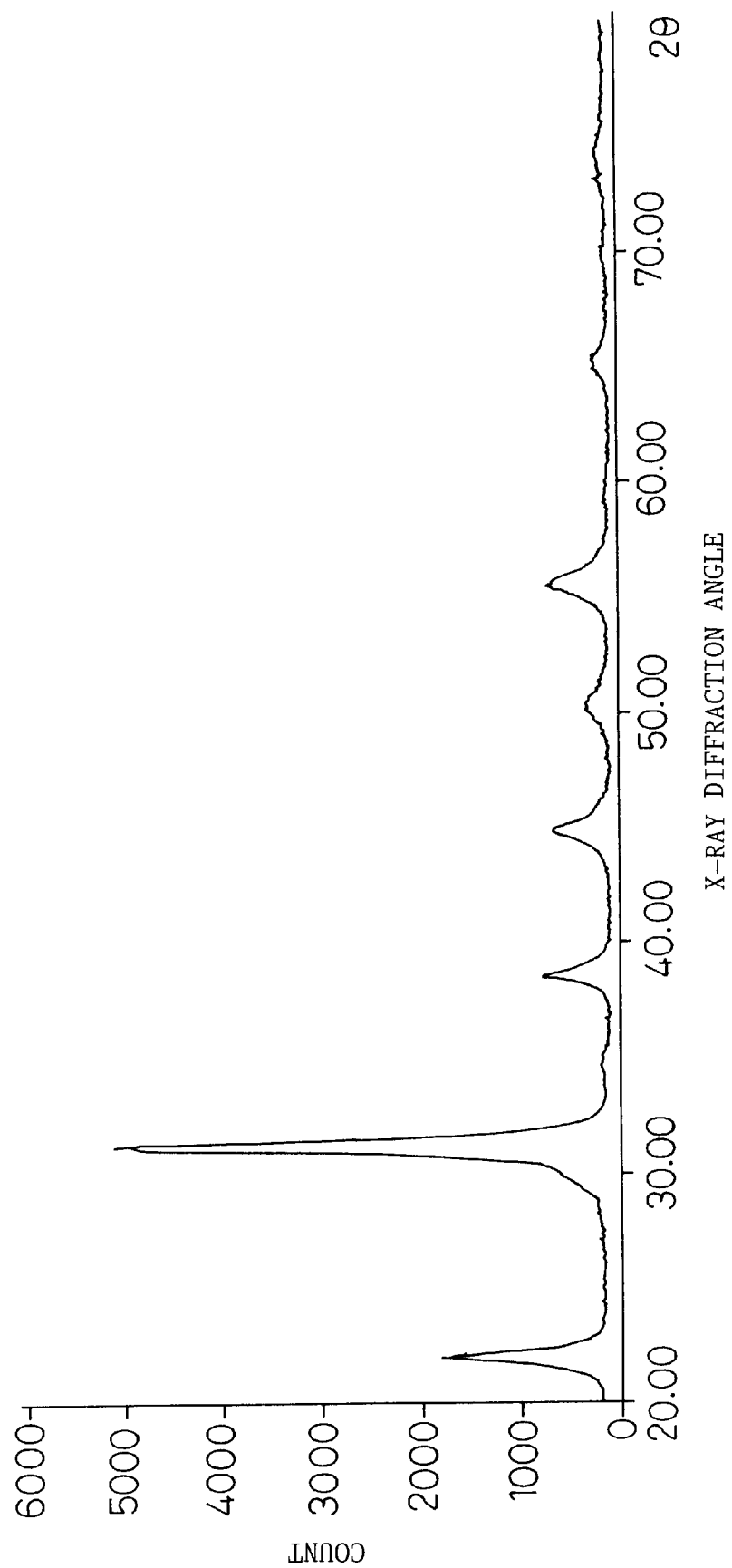
FIG. 12 is a graph showing an X-ray diffraction pattern of a thin layer of PZT prepared using hydroxypropyl cellulose as a thickener according to the present invention.

FIG. 12 shows an X-ray diffraction pattern of the thin layer of PZT thus formed. In the X-ray diffraction pattern, no diffraction peak other than peaks derived from PZT is observed, indicating that the layer formed on the platinum electrode is a thin layer of PZT.

Example 3

The procedure of Example 2 was repeated, except that, in the preparation of the aqueous PZT precursor solution in the same manner as in Example 1, polyethylene oxide (sample 3) and polyvinyl alcohol (sample 4) were used as a thickener instead of hydroxypropyl cellulose. As a result, satisfactory thin layers of PZT comparable with the thin layer of PZT formed in Example 2 could be formed.

Figure 13:
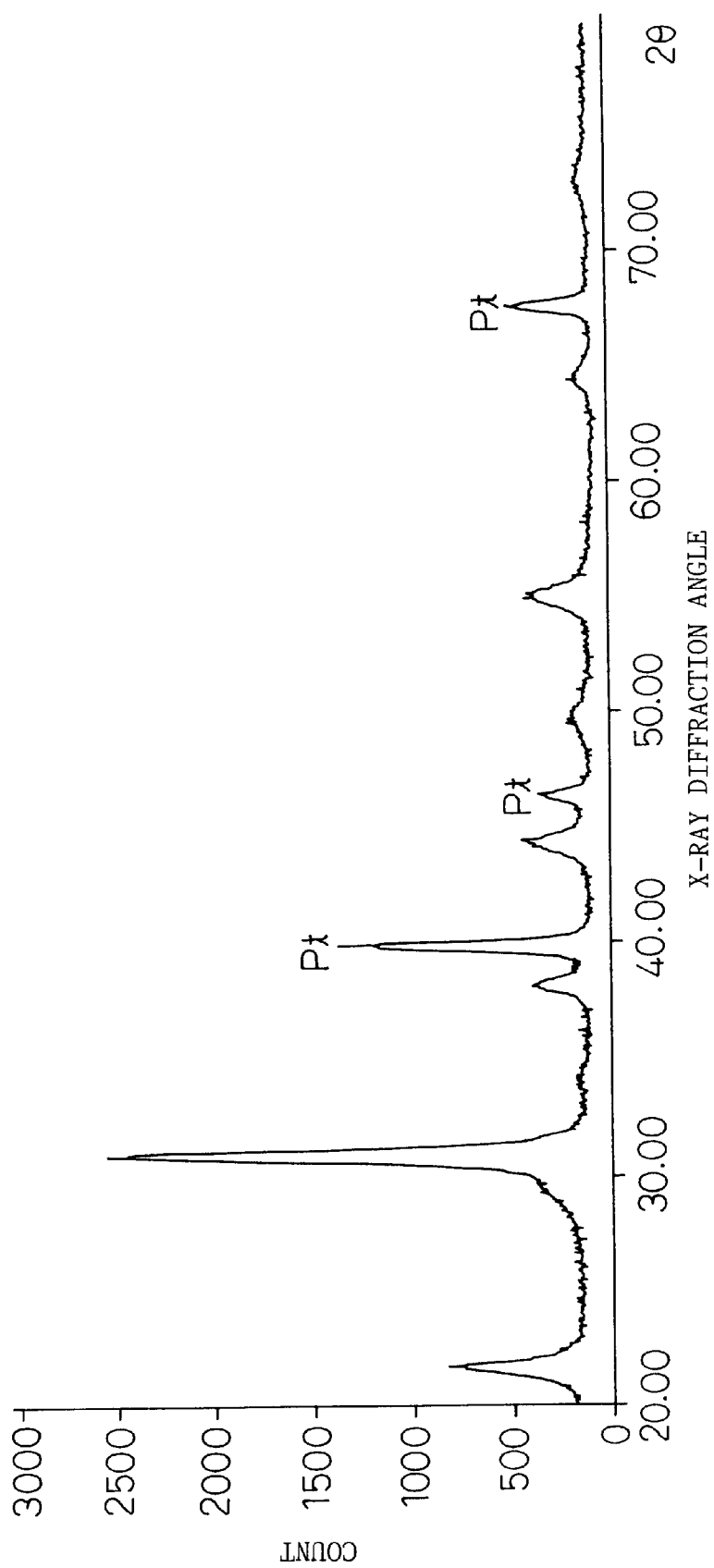
FIG. 13 is a graph showing an X-ray diffraction pattern of a thin layer of PZT prepared using polyethylene oxide as a thickener according to the present invention.
Figure 14:
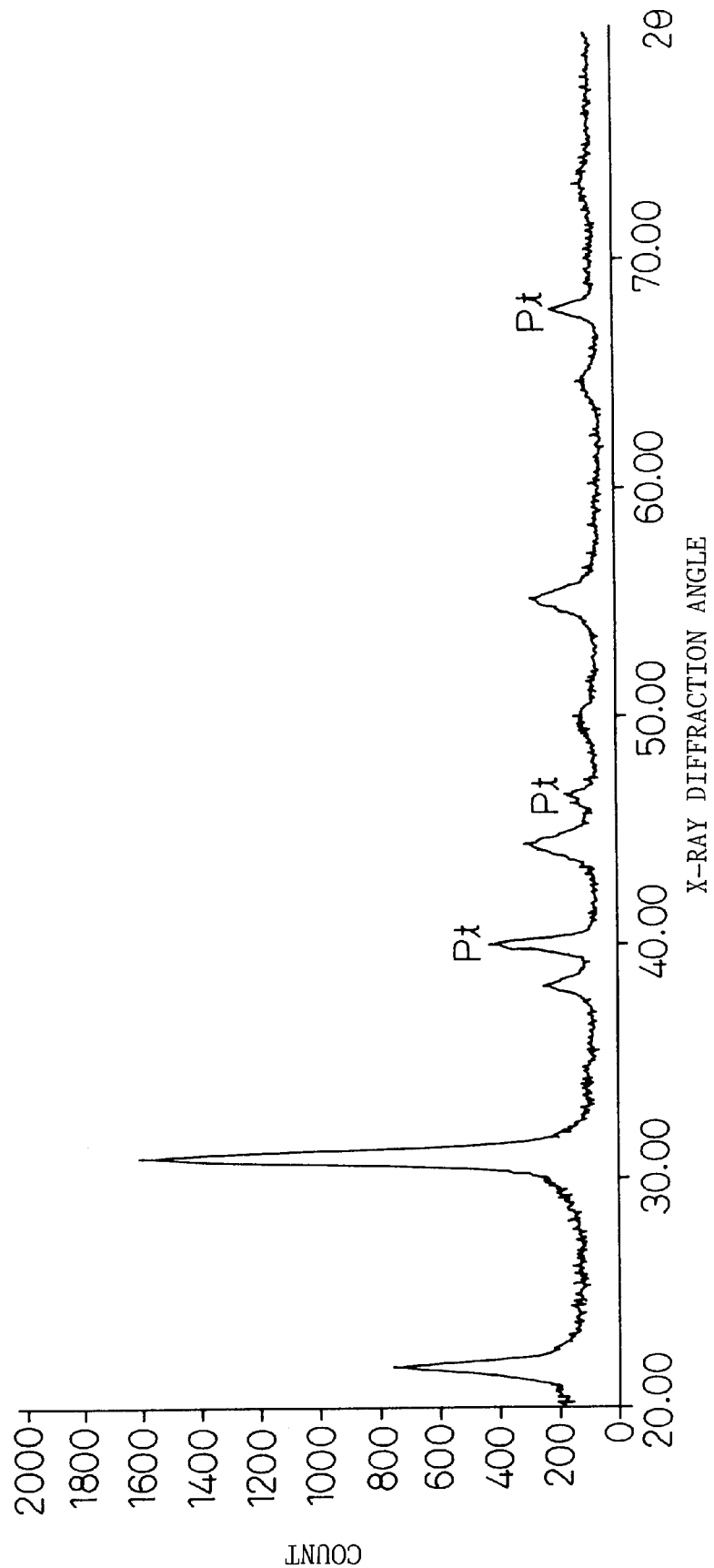
FIG. 14 is a graph showing an X-ray diffraction pattern of a thin layer of PZT prepared using polyvinyl alcohol as a thickener according to the present invention.

The X-ray diffraction patterns of the thin layers of PZT thus formed were as shown in FIG. 13 (sample 3) and FIG. 14 (sample 4). The thickness of the thin layers of PZT was so small that, in these X-ray diffraction patterns, peaks derived from the platinum electrode could be observed around diffraction angles, 2θ, of 40°, 47°, and 67°. Peaks other than the peaks derived from platinum were only those derived from PZT, indicating that the formed layer was a thin layer of PZT.

Example 4

0.014 mol of titanium tetrachloride was dissolved in aqueous ammonia, and the resultant titanium hydroxide was collected by filtration and washed. The titanium hydroxide was dissolved in a 3 N aqueous nitric acid solution to prepare an aqueous titanium solution. Separately, 0.016 mol of zirconium oxynitrate was dissolved in 20 g of pure water to prepare an aqueous zirconium solution. Further, 0.03 mol of lead nitrate was dissolved in 20 g of pure water to prepare an aqueous lead solution.

The three aqueous solutions thus prepared were mixed together to prepare an aqueous PZT precursor solution. At the outset, the aqueous titanium solution and the aqueous zirconium solution were thoroughly mixed together at room temperature while stirring. After the completion of the stirring, the mixture was mixed with the aqueous lead solution. The resultant mixture was thoroughly stirred at room temperature and then heated under reflux at a temperature of 100° C. or above to conduct hydrolysis. After the temperature of the resultant aqueous PZT precursor solution was returned to room temperature, water and a small amount (about 0.5% by weight) of hydroxypropyl cellulose were added thereto, followed by thorough mixing with stirring at room temperature for about one hr. As a result, a transparent, homogeneous solution was obtained which was neither cloudy nor contained any precipitate.

Example 5

A thin layer of PZT was formed from the aqueous PZT precursor solution prepared in Example 4, and the thin layer of PZT was incorporated as a piezoelectric element into a piezoelectric ink jet head having a structure shown in FIG. 1.

A diaphragm of a thin ceramic sheet was prepared, and a platinum electrode was formed in a predetermined area by sputtering. Further, the aqueous PZT precursor solution prepared in Example 4 was spin-coated at 2000 rpm onto the platinum electrode. The PZT coating on the platinum electrode was dried at 150° C. for 10 min and further pre-fired at 500° C. for one hr. As a result of the pre-firing, hydroxypropyl cellulose contained in the PZT coating was decomposed and scattered.

The PZT coating on the platinum electrode was then fired at 650° C. for one hr. This allowed the crystallization of PZT to proceed and a thin layer of PZT having a perovskite structure was obtained. This thin layer of PZT had good adhesion to the platinum electrode and the diaphragm and further exhibited satisfactory adhesion in the sputtering of an additional platinum electrode on the thin layer of PZT.

Example 6

In this example, lead nitrate ($Pb(NO_3)_2$), zirconium oxynitrate ($ZrO(NO_3)_2$), and titanium isopropoxide ($Ti(O-i-C_3H_7)_4$) were used as starting compounds.

At the outset, 4.03 g of titanium isopropoxide was dissolved in and mixed with 23.3 g of a 2.8 N aqueous nitric acid solution while stirring in a nitrogen atmosphere to give an aqueous titanium solution. Separately, 4.27 g of zirconium oxynitrate was dissolved in and mixed with 18 g of pure water while stirring to give an aqueous zirconium solution. After the preparation of the aqueous titanium solution and the aqueous zirconium solution, these aqueous solutions were mixed together while stirring to prepare a homogeneous solution. Separately, 10 g of lead nitrate was dissolved in and mixed with 32 g of pure water while stirring. The resultant aqueous lead solution was then mixed with the mixed aqueous solution containing titanium and zirconium while stirring. Finally, 10% by weight, based on the resultant mixture, of polyethylene glycol (weight average molecular weight=200) was added to the mixture. Thus, a homogeneous aqueous PZT precursor solution was prepared.

In the aqueous PZT precursor solution prepared above, the PZT concentration was 9% by weight, and the composition (molar ratio of metal elements contained) was Pb:Zr:Ti=1:0.53:0.47. Among a number of PZTs, the PZT having this molar ratio offered the maximum values respectively for the permittivity, the piezoelectric constant and the like.

The aqueous PZT precursor solution prepared above was then spin-coated on a Pt/Ti/Si substrate, and the coating was dried at 150° C. for 10 min, pre-fired at 500° C. for 60 min, and fired at 800° C. for 60 min. As a result, a dense thin layer of PZT having a thickness of 100 nm was formed. The thin layer of PZT was examined, and, as a result, precipitation of a material in a stripe form on the surface of the thin layer was not observed.

Further, in order to evaluate a change in the aqueous PZT precursor solution with the elapse of time, the aqueous PZT precursor solution was allowed to stand in air at room temperature for one month. As a result, no change occurred. Since polyethylene glycol used as the association preventive in this example has already been found, by TG-DTA (thermogravimetry-differential thermal analysis), to be a material which could be degreased at 300° C., it is considered that degreasing could be fully achieved in the step of pre-firing.

Example 7

The procedure of Example 6 was repeated, except that, in the preparation of the aqueous lead solution, lead acetate, instead of lead nitrate, was used in the same amount. As a result, a satisfactory thin layer of PZT comparable with the thin layer of PZT formed in Example 6 was formed.

Example 8

In order to evaluate the influence of an association preventive on lead (Pb) in an aqueous PZT precursor solution, the procedure of Example 6 was repeated, except that the amount of polyethylene glycol used as the association preventive was reduced from 10% by weight to 5% by weight. As a result, unlike Example 6 (amount of association preventive used: 10% by weight) wherein no association of lead was observed, in this example (amount of association preventive used: 5% by weight), the association of lead was significant.

The above results indicate that, since polyethylene glycol used here has an average molecular weight of 200 and a monomolecular weight of 63, a large amount of tetramer exists. In this case, regarding the length of the molecule, $Pb^{2+}$ is 1.2 Å, while polyethylene glycol in a tetramer form is several tens of Å. That is, the polyethylene glycol molecule is considerably longer than $Pb^{2+}$. It is considered that several molecules of $Pb^{2+}$ are coordinated to one molecule of polyethylene glycol, preventing the association of Pb.

Example 9

The procedure of Example 6 was repeated, except that glycerin was used instead of polyethylene glycol as the association preventive. As a result, a 100 nm-thick, dense, thin layer of PZT free from precipitation of a material in a stripe form was formed.

Further, the procedure of Example 8 was repeated. The results of evaluation indicate that, although there is a slight difference, as with Example 6, the association of lead could be effectively prevented.

Example 10

The procedure of Example 6 was repeated, except that diethylene glycol was used instead of polyethylene glycol as the association preventive. As a result, a 100 nm-thick, dense, thin layer of PZT free from precipitation of a material in a stripe form was formed.

Further, the procedure of Example 8 was repeated. The results of evaluation indicate that, although there is a slight difference, as with Example 6, the association of lead could be effectively prevented.

Example 11

In this example, lead nitrate ($Pb(NO_3)_2$), zirconium oxynitrate ($ZrO(NO_3)_2$), and titanium isopropoxide ($Ti(O-i-C_3H_7)_4$), were used as starting compounds.

At the outset, 4.03 g of titanium isopropoxide was dissolved in and mixed with 23.3 g of a 2.8 N aqueous nitric acid solution while stirring in a nitrogen atmosphere to give an aqueous titanium solution. Separately, 4.27 g of zirconium oxynitrate was dissolved in and mixed with 18 g of pure water while stirring to give an aqueous zirconium solution. After the preparation of the aqueous titanium solution and the aqueous zirconium solution, these aqueous solutions were mixed together while stirring to prepare a homogeneous solution. Separately, 10 g of lead nitrate was dissolved in and mixed with 32 g of pure water while stirring. The resultant aqueous lead solution was then mixed with the mixed aqueous solution containing titanium and zirconium while stirring. Finally, 10% by weight, based on the resultant mixture, of polyethylene glycol (weight average molecular weight=200) was added to the mixture. Thus, a homogeneous aqueous PZT precursor solution was prepared.

In the aqueous PZT precursor solution prepared above, the PZT concentration was 9% by weight, and the composition (molar ratio of metal elements contained) was Pb:Zr:Ti=1:0.53:0.47. Among a number of PZTs, the PZT having this molar ratio offered the maximum values respectively for the permittivity, the piezoelectric constant and the like.

To the aqueous PZT precursor solution were added a PZT powder having the same composition as the PZT and hydroxypropyl cellulose (as a binder) each in an amount of 10% by weight based on the aqueous PZT precursor solution. The mixture was milled by means of a planetary ball mill for 3 min to prepare a PZT precursor paste.

The PZT precursor paste thus prepared was coated on a Pt/Ti/Si substrate by using a metal mask and a doctor blade, and the coating was dried at 150° C. for 10 min, degreased at 500° C. for 60 min, and fired at 800° C. for 60 min. As a result, a 3 μm-thick, dense, thin layer of PZT was formed. The thin layer of PZT was examined and found to be free from cracking.

Thin layers of PZT having varied thicknesses (2 to 4 μm) were formed in the same manner as described above, except that the amount of polyethylene glycol (used in an amount of 10% by weight in the above case) and the amount of the PZT powder (used in an amount of 10% by weight in the above case) were varied. As a result, as with the above case, crack-free, dense, thin layers of PZT could be formed.

Figure 15:
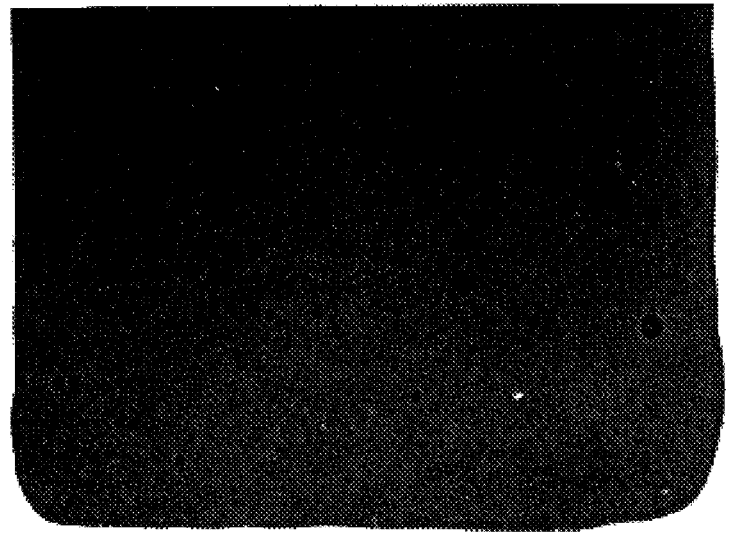
FIG. 15 is a microphotograph showing the surface state of a thin layer of PZT prepared using polyethylene glycol as an association preventive according to the present invention.

FIG. 15 is a microphotograph (magnification: 20×) showing the surface appearance of the thin layer of PZT (thickness 3 μm) thus formed. From this microphotograph, it is apparent that the surface of the thin layer of PZT is free from cracks, pinholes, and material in a stripe form.

Further, in order to evaluate a change in the aqueous PZT precursor solution with the elapse of time, the aqueous PZT precursor solution was allowed to stand in the air at room temperature for one month. As a result, no change occurred. Since polyethylene glycol used as the association preventive in this example has already been found, by TG-DTA, to be a material which could be degreased at 300° C., it is considered that degreasing could be fully achieved in the step of degreasing.

Example 12

Figure 16:
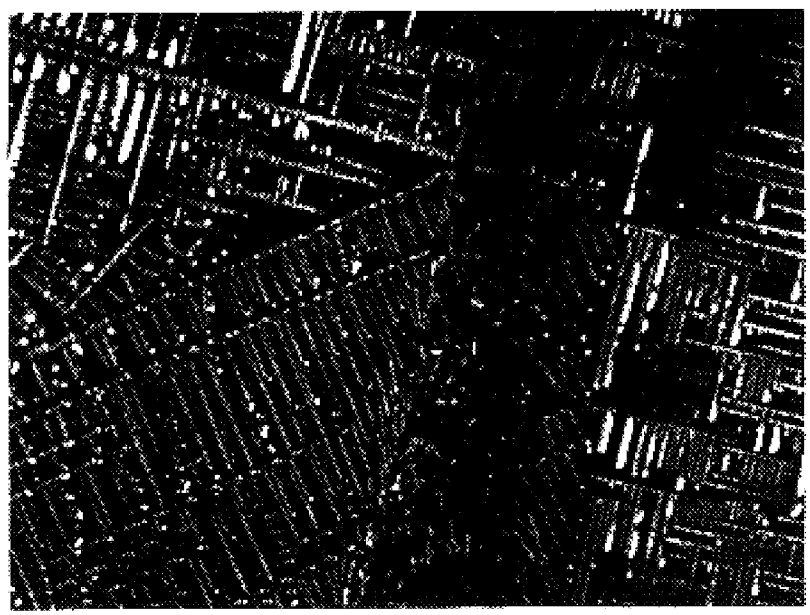
FIG. 16 is a microphotograph showing the surface state of a comparative thin layer of PZT (as a control) prepared using polyethylene glycol as the association preventive in a reduced amount.

In order to evaluate the influence of an association preventive on lead (Pb) in an aqueous PZT precursor solution, the procedure of Example 11 was repeated, except that the amount of polyethylene glycol used as the association preventive was reduced from 10% by weight to 5% by weight. As a result, unlike Example 11 (amount of association preventive used: 10% by weight) wherein no association of lead was observed, in this example (amount of association preventive used: 5% by weight), the association of lead was significant. The large number of defects in a stripe form appearing on the microphotograph (magnification: 20×) of the thin layer of PZT shown in FIG. 16 demonstrates the association of lead. Regarding the prevention of the association of Pb, the description in Example 8 is true of this example.

Example 13

The procedure of Example 11 was repeated, except that the PZT precursor paste was coated using a spatula instead of the doctor blade. As a result, as with Example 11, a crack-free, dense, thin layer of PZT (layer thickness 3 μm) was formed. The crystal structure of the thin layer of PZT was examined by X-ray diffractometry and found to be constituted by a single phase of PZT.

Example 14

The procedure of Example 11 was repeated, except that diethylene glycol was used instead of polyethylene glycol as the association preventive. As a result, as with Example 11, a dense, thin layer of PZT (layer thickness 3 μm) free from precipitation of a material in a stripe form and a crack was formed. This demonstrates that, as with use of polyethylene glycol (Example 11), use of diethylene glycol as the association preventive results in the preparation of a highly stable ferroelectric precursor and, in addition, coating of the precursor onto a substrate followed by firing can provide a ferroelectric element which is dense and possesses excellent piezoelectric properties.

Example 15

The procedure of Example 11 was repeated, except that glycerin was used instead of polyethylene glycol as the association preventive. As a result, as with Example 11, a crack-free, dense, thin layer of PZT (layer thickness 3 μm) free from precipitation of a material in a stripe form was formed. This demonstrates that, as with use of polyethylene glycol (Example 11), use of glycerin as the association preventive results in the preparation of a highly stable ferroelectric precursor and, in addition, coating of the precursor onto a substrate followed by firing can provide a ferroelectric element which is dense and possesses excellent piezoelectric properties.

Example 16

This example demonstrates the formation of a composite thin layer of PZT.

A first thin layer of PZT (substrate layer) was first prepared according to the following procedure. A solution of 0.00682 mol of lead nitrate in water, a solution of 0.00273 mol of zirconium oxychloride in water, and a solution of 0.05 mol of potassium hydroxide in water were mixed together. A titanium substrate was immersed in the mixed solution, followed by hydrothermal treatment at 150° C. for 24 hr. As a result, a crystal nucleus of PZT was produced on the surface of the titanium substrate. Separately, a solution of 0.00682 mol of lead nitrate in water, a solution of 0.00273 mol of zirconium oxychloride in water, a solution of 0.00252 mol of titanium tetrachloride in water, and a solution of 0.05 mol of potassium hydroxide in water were mixed together, and the titanium substrate with a PZT crystal nucleus prepared in the above step was then immersed in the resultant mixed solution, followed by hydrothermal treatment at 120° C. for 48 hr. Thus, a first thin layer of PZT having an average particle diameter of 5 μm and a very poor surface smoothness was obtained.

Subsequently, on the first thin layer of PZT, formed on the titanium substrate, was formed a second thin layer of PZT from an aqueous PZT precursor solution by the sol-gel process according to the following procedure.

At the outset, 0.014 mol of titanium tetraisopropoxide was dissolved in 30 g of a 3 N aqueous nitric acid solution to prepare an aqueous titanium solution. Separately, 0.016 mol of zirconium oxynitrate was dissolved in 20 g of pure water to prepare an aqueous zirconium solution. Further, 0.03 mol of lead nitrate was dissolved in 20 g of pure water to prepare an aqueous lead solution. In this connection, it should be noted that the ratio of Zr to Ti in PZT is closely related to the ferroelectricity and this ratio is determined by the molar ratio of the corresponding metal salts. Therefore, the aqueous solutions of respective metal salts were prepared so that mixing was performed in a desired molar ratio.

The aqueous titanium solution and the aqueous zirconium solution were thoroughly mixed together at room temperature while stirring, and the aqueous lead solution was then added to and mixed with the mixture. The present inventors have found that in practicing the present invention, the addition of aqueous metal salt solutions in the above order is preferred. The resultant mixture was thoroughly stirred at room temperature and then heated under reflux at a temperature of 100° C. or above to conduct hydrolysis. Metal ions contained in each aqueous metal salt solution, when the aqueous solutions were mixed together at room temperature, merely formed metal hydroxides corresponding to respective metal ions, and the degree of bonding among the metal ions was small. Subsequent reflux and hydrolysis, however, permitted the metal ions, that is, titanium, zirconium, and lead ions, to be bonded to one another through oxygen. In this case, a Pb—O—Ti—O—Zr bond was formed to bring the system to a sol. In the present invention, the aqueous solution in this sol stage is an aqueous PZT precursor solution referred to in the present invention.

The temperature of the aqueous precursor solution was returned to room temperature, water and a small amount of hydroxypropyl cellulose were added dropwise thereto, followed by thorough mixing with stirring. In this case, the purpose of adding hydroxypropyl cellulose is to increase the viscosity of the aqueous PZT precursor solution having relatively low viscosity and to enable the formation of a coating having large thickness in the coating of the aqueous PZT precursor solution on the substrate. Not only has hydroxypropyl cellulose the effect of increasing the viscosity, but also the effect of strengthening the Pb—O—Ti—O—Zr bond and the effect of reducing the distance among the ions. This can lower the firing temperature in the layer formation and in addition can improve the crystallinity of the layer. The aqueous PZT precursor solution after the addition of hydroxypropyl cellulose was a transparent, homogeneous solution which was neither cloudy nor contained any precipitate.

The aqueous PZT precursor solution thus prepared was spin-coated onto the substrate with the first thin layer of PZT formed above. In this case, the aqueous PZT precursor solution coated on the substrate with the first thin layer of PZT is in the uncrystallized state. Therefore, the coating was dried at 150° C. for 10 min and once fired at a temperature of 500° C. or above to decompose hydroxypropyl cellulose as the additive.

After the completion of the firing for the decomposition of hydroxypropyl cellulose, the substrate was fired at 650° C. for one hr, thereby forming a second PZT structure having significantly enhanced surface smoothness. Thus, a more dense, composite thin layer of PZT was obtained which had no boundary between the first thin layer and the second thin layer.

In the production of an ink jet head, the thin layer of PZT, which has been formed through the above series of steps, has good adhesion to a diaphragm and an electrode to be jointed to a piezoelectric element comprising the thin layer of PZT, so that they can be integrally bonded without the aid of any adhesive. Use of the hydrothermal synthesis with the sol-gel process can bring the firing temperature to a relatively lower value than that in the case of the conventional solid phase process. Therefore, the range of selection of the diaphragm as the substrate can be broadened.

Example 17

The procedure of Example 16 was repeated, except that the second thin layer of PZT was formed according to the following procedure.

0.014 mol of titanium tetrachloride was dissolved in aqueous ammonia, and the resultant titanium hydroxide was collected by filtration and washed. The collected titanium hydroxide was dissolved in a 3 N aqueous nitric acid solution to prepare an aqueous titanium solution. Separately, 0.016 mol of zirconium oxynitrate was dissolved in 20 g of pure water to prepare an aqueous zirconium solution. Further, 0.03 mol of lead nitrate was dissolved in 20 g of pure water to prepare an aqueous lead solution.

The aqueous titanium solution and the aqueous zirconium solution were thoroughly mixed together at room temperature while stirring. The aqueous lead solution was added to and mixed with the mixture. The mixed solution was thoroughly stirred at room temperature and heated under reflux at a temperature of 100° C. or above to conduct hydrolysis. The temperature of the resultant mixed solution after the hydrolysis was returned to room temperature, water and a minor amount of hydroxypropyl cellulose were added dropwise thereto, followed by thorough mixing with stirring. As a result, a homogeneous PZT solution was obtained.

The PZT solution thus prepared was spin-coated onto the titanium substrate with the first thin layer of PZT formed above. The coating was dried at 150° C. for 10 min and once fired at a temperature of 500° C. or above to decompose hydroxypropyl cellulose as the additive. Finally, firing was performed at 650° C. for one hr, thus completing the formation of a second thin layer of PZT.

As with the composite thin layer of PZT prepared in Example 16, the composite thin layer of PZT prepared in this example was satisfactory.

Industrial Applicability

According to the present invention, aqueous solutions of respective metal oxides constituting a ferroelectric material are prepared and mixed together to prepare a mixed solution as a ferroelectric precursor, and additives characteristic of the present invention, such as a thickener and an association preventive, are added. This constitution can offer many advantages unexpected from the prior art. For example, according to the present invention, the use of the aqueous metal oxide solution as the ferroelectric precursor is advantageous in that handling and preparation are easy and, in addition, the storage stability of the starting compound solution is excellent, addition of an association preventive can enhance the stability of the precursor, a ferroelectric element can be easily produced at low cost and can be formed as a thin layer, and, since particles on the surface of the thin layer are fine and dense, excellent surface smoothness can be realized.

Further, according to the present invention, addition of a ferroelectric powder, an organic binder and the like to prepare a precursor paste followed by the formation of a thin layer of a ferroelectric can prevent the creation of defects, such as precipitation of a material in a stripe form, on the surface of the thin layer of a ferroelectric, can provide a dense, homogeneous, thin layer of a ferroelectric, ensuring excellent piezoelectric properties. In addition, this can prevent the creation of cracking on the surface of the thin layer.

Furthermore, according to the present invention, stacking of a second thin layer of a ferroelectric prepared by the sol-gel process on a first thin layer of a ferroelectric prepared by hydrothermal synthesis enables the thickness of the ferroelectric element to be increased while maintaining the features of the ferroelectric element of the present invention and, in addition, can offer good adhesion to the underlying substrate.

In addition, application of the ferroelectric element of the present invention as a piezoelectric element to a piezoelectric ink jet head can, of course, offer excellent piezoelectric properties and, further, permits an electrode to be easily formed on the piezoelectric element without creating any defect.

What is claimed is:

1. A ferroelectric element in the form of a thin layer comprising a ferroelectric material containing at least two metals, said ferroelectric material having been produced by (i) preparing an aqueous ferroelectric precursor solution from respective hydroxides of the metals; (ii) mixing the aqueous precursor solution with a thickener, an association preventive, or a combination thereof; (iii) forming a coating of the resulting mixture, and (iv) firing the coating to form the thin layer.

2. The ferroelectric element according to claim 1, wherein the thickener comprises a water-soluble polymeric material which, when heated to a temperature above a predetermined temperature at the time of the formation of the ferroelectric element, can be heat-decomposed.

3. The ferroelectric element according to claim 2, wherein the thickener comprises at least one compound selected from the group consisting of hydroxyalkyl, cellulose, polyethylene oxide, and polyvinyl alcohol.

4. The ferroelectric element according to claim 1, wherein the association preventive comprises a water-soluble polyhydric alcohol.

5. The ferroelectric element according to claim 4, wherein the polyhydric alcohol comprises at least one compound selected from the group consisting of diethylene glycol, polyethylene glycol, and glycerin.

6. The ferroelectric element according to any one of claims 1 to 5, wherein a powder of another ferroelectric material having a crystal structure identical or similar to the ferroelectric material is present in addition to the thickener and/or the association preventive.

7. The ferroelectric element according to claim 1, wherein the ferroelectric material is a ceramic having a perovskite structure and one of the metals is lead.

8. The ferroelectric element according to claim 7, wherein the salt of lead is lead nitrate or lead acetate.

9. The ferroelectric element according to claim 7, wherein the ceramic is lead zirconate titanate.

10. The ferroelectric element according to claim 1, which further comprises a substrate layer of a ferroelectric material having a crystal structure identical or similar to said ferroelectric material containing at least two metals and that has been formed by hydrothermal synthesis from aqueous solutions of metals necessary for the formation of the substrate layer.

11. The ferroelectric element according to claim 10, wherein the particle diameter of the ferroelectric material of the substrate layer is larger than that of said ferroelectric material containing at least two metals and constituting an overlying layer.

* * * * *